United States Patent
Song et al.

(10) Patent No.: US 9,129,846 B2
(45) Date of Patent: Sep. 8, 2015

(54) SEMICONDUCTOR PACKAGE AND METHOD OF FORMING

(71) Applicant: Samsung Electronics Co., Ltd., Suwon-si, Gyeonggi-do (KR)

(72) Inventors: In-sang Song, Yongin-si (KR); In-Ku Kang, Suwon-si (KR); Joon-hee Lee, Yongin-si (KR); Kyung-man Kim, Asan-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/511,149

(22) Filed: Oct. 9, 2014

(65) Prior Publication Data

US 2015/0102506 A1  Apr. 16, 2015

(30) Foreign Application Priority Data

Oct. 14, 2013  (KR) .................. 10-2013-0122188

(51) Int. Cl.
*H01L 23/52* (2006.01)
*H01L 25/10* (2006.01)

(52) U.S. Cl.
CPC ....... *H01L 25/105* (2013.01); *H01L 2225/1023* (2013.01); *H01L 2225/1052* (2013.01)

(58) Field of Classification Search
USPC ........... 257/777, E25.006, E25.013, E25.021, 257/E25.027, E23.085
See application file for complete search history.

(56) References Cited

U.S. PATENT DOCUMENTS

| | | | |
|---|---|---|---|
| 7,071,574 B1 * | 7/2006 | Nojiri et al. ................ | 257/784 |
| 7,541,680 B2 * | 6/2009 | Kwon et al. ................ | 257/777 |
| 7,663,245 B2 * | 2/2010 | Lim ........................... | 257/777 |
| RE41,826 E * | 10/2010 | Nishida et al. .............. | 257/777 |
| 8,203,204 B2 | 6/2012 | Kim | |
| 8,368,197 B2 | 2/2013 | Kook | |
| 8,415,808 B2 | 4/2013 | Liao et al. | |
| 2009/0057870 A1 | 3/2009 | Chung | |
| 2009/0321501 A1 | 12/2009 | Liang et al. | |
| 2010/0155938 A1 | 6/2010 | Martinez et al. | |
| 2010/0187690 A1 | 7/2010 | Okada et al. | |
| 2011/0062596 A1 | 3/2011 | Murayama et al. | |
| 2012/0313228 A1 | 12/2012 | Haba et al. | |

* cited by examiner

*Primary Examiner* — Jasmine Clark

(74) *Attorney, Agent, or Firm* — Renaissance IP Law Group LLP

(57) ABSTRACT

The semiconductor package includes: a package substrate comprising a bonding pad; a plurality of semiconductor chips stacked on the package substrate; and a bonding wire configured to electrically connect the semiconductor chips and the bonding pad. For at least one of the plurality of semiconductor chips: the semiconductor chip comprises: a semiconductor device; a first pad electrically connected to the semiconductor device; a conductive pattern; and a second pad electrically connected to the first pad, spaced apart from the conductive pattern, and extending over the conductive pattern; and the bonding wire is connected to the second pad.

17 Claims, 31 Drawing Sheets

US 9,129,846 B2

SEMICONDUCTOR PACKAGE AND METHOD OF FORMING

CROSS-REFERENCE TO RELATED APPLICATIONS

This application claims the benefit of Korean Patent Application No. 10-2013-0122188, filed on Oct. 14, 2013, in the Korean Intellectual Property Office, the disclosure of which is incorporated herein in its entirety by reference.

BACKGROUND

This disclosure relates to a semiconductor package, and more particularly, to a semiconductor package including semiconductor chips that are stacked.

Electronic devices have been miniaturized, highly integrated, and multi-functional according to rapid progress in electronic industries and user demand, and thus, semiconductor packages used in electronic devices also have become miniaturized, highly integrated, and multi-functional. In addition, semiconductor packages are required to include multiple semiconductor chips. However, when multiple semiconductor chips are included in a single semiconductor package, a thickness and/or an area of the semiconductor package increases, which problematically increases a volume of the semiconductor package.

SUMMARY

An embodiment includes a semiconductor package including: a package substrate comprising a bonding pad; a plurality of semiconductor chips stacked on the package substrate; and a bonding wire configured to electrically connect the semiconductor chips and the bonding pad. For at least one of the plurality of semiconductor chips: the semiconductor chip comprises: a semiconductor device; a first pad electrically connected to the semiconductor device; a conductive pattern; and a second pad electrically connected to the first pad, spaced apart from the conductive pattern, and extending over the conductive pattern; and the bonding wire is connected to the second pad.

An embodiment includes a semiconductor package comprising: a package substrate; and a plurality of semiconductor chips stacked on the package substrate, at least one of the semiconductor chips comprising: a semiconductor device formed on a semiconductor substrate; a first pad electrically connected to the semiconductor device; a conductive pattern extending adjacent an edge of the semiconductor substrate from the first pad and integrally formed with the first pad; and a second pad electrically connected to the first pad, spaced apart from the conductive pattern, and extending over the conductive pattern. The plurality of semiconductor chips are shifted such that at least a part of the second pad of the at least one of the semiconductor chips is exposed.

An embodiment includes a method, comprising: providing a package substrate; mounting a first semiconductor chip on the package substrate, the first semiconductor chip comprising: a semiconductor device; a first pad electrically connected to the semiconductor device; a conductive pattern; and a second pad electrically connected to the first pad, spaced apart from the conductive pattern, and extending over the conductive pattern; and mounting a second semiconductor chip on the first semiconductor chip such that at least part of the second pad is covered by the semiconductor chip and at least another part of the second pad is exposed.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Figure 1A:
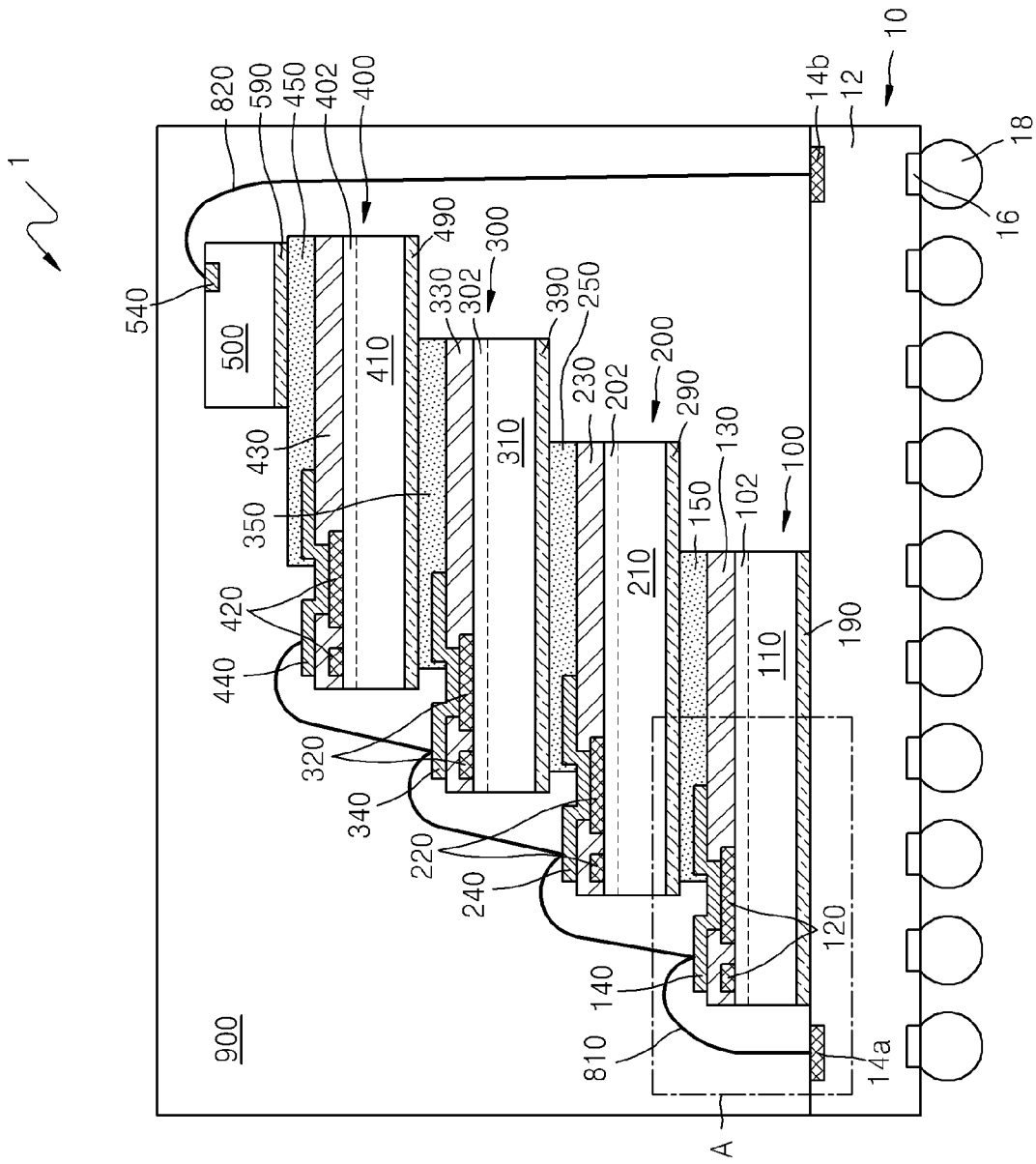
FIGS. 1A through 4B are cross-sectional views of semiconductor packages according to some embodiments.

Embodiments will now be described more fully with reference to the accompanying drawings, in which exemplary embodiments are shown. Embodiments may, however, take many different forms by one of ordinary skill in the art without departing from the technical teaching of the inventive concept. In other words, particular structural and functional description of the embodiments are provided in descriptive sense only; various changes in form and details may be made therein and thus should not be construed as being limited to the particular embodiments set forth herein. Embodiments are not limited to the particular embodiments described herein, and thus it should be understood that other embodiments may include every kind of variation examples or alternative equivalents included in the spirit and scope of this disclosure.

It will be understood that when an element is referred to as being "connected to", or "contacting" another element throughout the specification, it can be directly "connected to" or "contacting" the other element, or intervening elements may also be present. On the other hand, when a component is referred to as being "directly connected to" or "directly contacting" another element, it will be understood that no intervening element is present. Other words used to describe the relationship between elements should be interpreted in a like fashion (e.g., "between," versus "directly between," "adjacent," versus "directly adjacent," etc.).

In the present description, terms such as 'first', 'second', etc. are used to describe various elements. However, these elements should not be limited by these terms. The terms are used only for distinguishing one element from another element. For example, a first element could be termed a second element, and similarly, a second element may be termed a first element, without departing from the teaching of this disclosure.

As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art. As used herein, the term "and/or" includes any and all combinations of one or more of the associated listed items. Expressions such as "at least one of" when preceding a list of elements, modify the entire list of elements and do not modify the individual elements of the list.

As used herein, unless the context clearly indicates otherwise, an area means an area in parallel to a main surface of a package base substrate, and a thickness means a thickness in a vertical direction with respect to the main surface of a package base substrate. Unless the context clearly indicates otherwise, the vertical direction or a perpendicular direction is the vertical direction or the perpendicular direction with respect to the main surface of a package base substrate. When a shape of an element is a thin plate shape, an area means an area of a top surface and/or a bottom surface of the plate shape, and a thickness means an interval between the top surface and the bottom surface of the plate shape. Unless the context clearly indicates otherwise herein, a top surface of an element stacked on the package base substrate means a surface opposite to the package base substrate, and a top surface thereof means a surface facing the package base substrate.

FIGS. 1A through 4B are cross-sectional views of semiconductor packages 1, 2, 3, and 4 according to embodiments of the inventive concept. Referring to FIGS. 1A through 4B, the semiconductor packages 1, 2, 3, and 4 include multiple semiconductor chips 100, 200, 300, and 400 stacked on a package base substrate 10. The semiconductor chips 100, 200, 300, and 400 may be shifted by a predetermined distance in a first direction that is a perpendicular direction with respect to a main surface of the package base substrate 10 and may be sequentially stacked on the package base substrate 10 in such a way that a part of a top surface of a lower semiconductor chip is exposed.

The package base substrate 10 may be a printed circuit board (PCB) but is not limited thereto. The package base substrate 10 may include, for example, the PCB, a lead frame, or any substrate suitable for mounting semiconductor chips. If the package base substrate 10 is the PCB, the package base substrate 10 may include bonding pads 14a, 14b, and 16 that are exposed through a solder resist layer (not shown) on top and bottom surfaces of the package base substrate 10. The bonding pads 14a, 14b, and 16 may include the top surface pads 14a and 14b and the bottom surface pads 16. When the package base substrate 10 is the lead frame, the package base substrate 10 may include multiple leads.

A base substrate 12 may be formed of at least one material such as phenol resin, epoxy resin, polyimide, or the like. For example, the base substrate 12 may include at least one material such as FR4, tetrafunctional epoxy, polyphenylene ether, epoxy/polyphenylene oxide, bismaleimidetriazine, thermount, cyanate ester, polyimide, liquid crystal polymer, or the like. The top surface pads 14a and 14b and the bottom surface pads 16 may be formed of copper, nickel, stainless steel, beryllium copper, or the like. An inner wiring (not shown) that is electrically connected to the top surface pads 14a and 14b and the bottom surface pads 16 may be formed in or on the base substrate 12.

The top surface pads 14a and 14b and the bottom surface pads 16 may be parts, which are exposed by the solder resist layer, of a circuit wiring that is coated with a Cu foil or other conductive foil and patterned.

The top surface pads 14a and 14b may include a first top surface pad 14a and a second top surface pad 14b. The first top surface pad 14a may be connected to a first bonding wire 810. The first bonding wire 810 may be electrically connected to the semiconductor chips 100, 200, 300, and 400 and the package base substrate 10. The second top surface pad 14b may be connected to a second bonding wire 820. The second bonding wire 820 may be electrically connected to an auxiliary semiconductor chip 500 and the package base substrate 10. The semiconductor chips 100, 200, 300, and 400 and the auxiliary semiconductor chip 500 may be electrically connected to each other via the package base substrate 10.

Alternatively, the first bonding wire 810 and the second bonding wire 820 may be commonly connected to the first and second top surface pads 14a and 14b so that the semiconductor chips 100, 200, 300, and 400 and the auxiliary semiconductor chip 500 may be electrically connected to each other via the first and second top surface pads 14a and 14b.

A contact terminal 18 for a connection to an external apparatus may be formed on the bottom surface pad 16. The contact terminal 18 may be, for example, a solder ball, a conductive bump, or the like.

Although one first top surface pad 14a, one second top surface pad 14b, and one bottom surface pad 16 have been described, multiple first top surface pads 14a and multiple second top surface pads 14b may be present and coupled to one or more of the semiconductor chips 100, 200, 300, and 400 or in the auxiliary semiconductor chip 500 and multiple bottom surface pads 16 may be present to input and output data, provide a power source and ground, and transfer a control signal.

The semiconductor chips 100, 200, 300, and 400 may include the first semiconductor chip 100, the second semiconductor chip 200, the third semiconductor chip 300, and the fourth semiconductor chip 400. The semiconductor chips 100, 200, 300, and 400 are stacked but need not be. For example, the semiconductor packages 1, 2, 3, and 4 may be formed by stacking two, three, five or more semiconductor chips on the package base substrate 10. Semiconductor devices 102, 202, 302, and 402 may be respectively formed on semiconductor substrates 110, 210, 310, and 410 in the semiconductor chips 100, 200, 300, and 400. The semiconductor substrates 110, 210, 310, and 410 may respectively include active surfaces 112, 212, 312, and 412 and non-active surfaces 114, 214, 314, and 414 opposite to the active surfaces 112, 212, 312, and 412. In FIGS. 1B, 2B, 3B, and 4B, only active surface 112 and non-active surfaces 114 and 214 are illustrated as only a portion of semiconductor chips 100 and 200 are illustrated. The active surfaces 212, 312, and 412 correspond to the active surface 112, but on the semiconductor chips 200, 300, and 400. Similarly, the non-active surfaces 314 and 414 correspond to the non-active surface 114, but on the semiconductor chips 300 and 400. The semiconductor devices 102, 202, 302, and 402 may be respectively formed on the active surfaces 112, 212, 312, and 412 of the semiconductor substrates 110, 210, 310, and 410.

The non-active surfaces 114, 214, 314, and 414 may be disposed in the semiconductor chips 100, 200, 300, and 400 to face the package base substrate 10. Die adhesive films 190, 290, 390, and 490 may be respectively attached to the non-active surfaces 114, 214, 314, and 414 and then sequentially stacked on the package base substrate 10 in the semiconductor chips 100, 200, 300, and 400.

The active surfaces 112, 212, 312, and 412 of the semiconductor chips 100, 200, 300, and 400 may be top surfaces, and the non-active surfaces 114, 214, 314, and 414 may be bottom surfaces. The semiconductor chips 100, 200, 300, and 400 may be shifted by a predetermined distance in a first direction that is a horizontal with a main surface of the package base substrate 10 and may be sequentially stacked on the package base substrate 10 such that a part of an active surface of a lower semiconductor chip, if any, is exposed. That is, the second semiconductor chip 200 may be stacked on the package base substrate 10 such that a part of the active surface 112 of the first semiconductor chip 100 is exposed, the third semiconductor chip 300 may be stacked on the package base substrate 10 such that a part of the active surface 212 of the second semiconductor chip 200 is exposed, and the fourth semiconductor chip 400 may be stacked on the package base substrate 10 such that a part of the active surface 312 of the third semiconductor chip 300 is exposed. Similarly, the auxiliary semiconductor chip 500 may be stacked on the package base substrate 10 such that a part of the active surface 412 of the fourth semiconductor chip 400 is exposed.

The semiconductor substrates 110, 210, 310, and 410 may include, for example, silicon (Si). Alternatively, the semiconductor substrates 110, 210, 310, and 410 may include a semiconductor atom such as germanium (Ge) or a compound semiconductor such as silicon carbide (SiC), gallium arsenide (GaAs), indium arsenide (InAs), and indium phosphide (InP). Alternatively, the semiconductor substrates 110, 210, 310, and 410 may have a silicon on insulator (SOI) structure. For example, the semiconductor substrates 110, 210, 310, and 410 may include a buried oxide layer (BOX) layer. Each of the semiconductor substrates 110, 210, 310, and 410 may include a conductive region, for example, a well doped with impurities or a structure doped with impurities. The semiconductor substrates 110, 210, 310, and 410 may have diverse device isolation structures such as a shallow trench isolation (STI) structure. Although particular materials and structures have been used as examples for the semiconductor substrates 110, 210, 310, and 410, the semiconductor substrates 110, 210, 310, and 410 may include other materials and structures.

The semiconductor devices 102, 202, 302, and 402 may include a large scale integration (LSI) system, flash memory, DRAM, SRAM, EEPROM, PRAM, MRAM, or RRAM. In more detail, the semiconductor devices 102, 202, 302, and 402 may include various types of individual devices. The individual devices may include diverse microelectronic devices, for example, a metal-oxide-semiconductor field effect transistor (MOSFET) such as a complementary metal-insulator-semiconductor (CMOS) transistor, the LSI system, an image sensor such as a CMOS imaging sensor (CIS), a micro-electro-mechanical system (MEMS), an active device, a passive device, combinations of such devices, or the like. The individual devices may be electrically connected to the conductive regions of the semiconductor substrates 110, 210, 310, and 410. The semiconductor devices 102, 202, 302, and 402 may further include conductive wirings or conductive plugs that are used to electrically connect at least two of the individual devices or the conductive region of the semiconductor substrates 110, 210, 310, and 410 and the individual device. The neighboring individual devices may be electrically separated from each other via insulation films.

The semiconductor devices 102, 202, 302, and 402 may be configured to include multiple wiring structures used to connect the individual devices to other wirings formed in the semiconductor substrates 110, 210, 310, and 410. Each of the wiring structures may include a metal wiring layer and a via plug. The metal wiring layer and via plug may be configured as a wiring barrier film and a wiring metal layer. The wiring barrier film may include Ti, TiN, Ta, TaN, or the like. The wiring metal layer may include W, Al, Cu, or the like. The metal wiring layer and via plug may be formed of the same material. Alternatively, at least one of the metal wiring layer and via plug may be configured to include different materials. The metal wiring layers and/or via plugs may have a multilayer structure. That is, the wiring structures may have a multilayer structure in which two or more metal wiring layers or two or more via plugs are alternatively stacked.

The semiconductor chips 100, 200, 300, and 400 may include first pads 122, 222, 322, and 422 that are electrically connected to semiconductor devices 102, 202, 302, and 402 respectively. The semiconductor chips 100, 200, 300, and 400 may include conductive patterns 124, 224, 324, and 424 that have the same levels as the first pads 122, 222, 322, and 422 or are integrally formed with the first pads 122, 222, 322, and 422. The first pads 122, 222, 322, and 422 and the conductive patterns 124, 224, 324, and 424 may be one layer among the metal wiring layers having the multilayer structure. The conductive patterns 124, 224, 324, and 424 may be adjacent to edges of the semiconductor substrates 110, 210, 310, and 410 rather than the first pads 122, 222, 322, and 422.

The conductive patterns 124, 224, 324, and 424 may be electrically connected to the first pads 122, 222, 322, and 422. The conductive patterns 124, 224, 324, and 424 and the first pads 122, 222, 322, and 422 may be integrally formed so as to be physically connected to each other, may be electrically connected to each other at the same level, or may be connected in other ways. For example, the conductive patterns 124, 224, 324, and 424 may be independent patterns that are physically separated from the first pads 122, 222, 322, and 422 at the same level, and may be electrically connected to the first pads 122, 222, 322, and 422 at different levels in the semiconductor chips 100, 200, 300, and 400, for example, via the semiconductor devices 102, 202, 302, and 402 or via the package base substrate 10.

The conductive patterns 124, 224, 324, and 424 may be, for example, power line patterns that transfer power source or ground signals that are input into the first pads 122, 222, 322, and 422, to different parts of the semiconductor chips 100, 200, 300, and 400. The conductive patterns 124, 224, 324, and 424 may be, for example, a structure for protecting the semiconductor chips 100, 200, 300, and 400 from static electricity ESD that may be applied to the first pads 122, 222, 322, and 422 or a part of the structure.

The conductive patterns 124, 224, 324, and 424 may be formed to be adjacent to the edges of the semiconductor substrates 110, 210, 310, and 410 to minimize influences that may be applied to the semiconductor devices 102, 202, 302, and 402. For example, the conductive patterns 124, 224, 324, and 424 may be formed to be more closely adjacent to the edges of the semiconductor substrates 110, 210, 310, and 410 than the first pads 122, 222, 322, and 422.

The semiconductor chips 100, 200, 300, and 400 may respectively further include second pads 140, 240, 340, and 440 that are connected onto the first pads 122, 222, 322, and 422 and extend onto the conductive patterns 124, 224, 324, and 424. The second pads 140, 240, 340, and 440 may be spaced apart from the conductive patterns 124, 224, 324, and 424 and may extend onto the conductive patterns 124, 224, 324, and 424. The second pads 140, 240, 340, and 440 may include, for example, W, Al, Cu, Ti, TiN, Ta, TaN, Au, or the like.

The semiconductor chips 100, 200, 300, and 400 may further respectively include first insulation layers 130, 230, 330, and 430 that have openings through which a part of the first pads 122, 222, 322, and 422 is exposed and cover the conductive patterns 124, 224, 324, and 424. The second pads 140, 240, 340, and 440 may extend over the conductive patterns 124, 224, 324, and 424 where the first insulation layers 130, 230, 330, and 430 interposed between the second pads 140, 240, 340, and 440 and the conductive patterns 124, 224, 324, and 424. That is, the second pads 140, 240, 340, and 440 may extend over portions of the first insulation layers 130, 230, 330, and 430 that cover the conductive patterns 124, 224, 324, and 424. The second pads 140, 240, 340, and 440 may extend to the edges of the semiconductor substrates 110, 210, 310, and 410 or may extend to be adjacent to and spaced apart from the edges of the semiconductor substrates 110, 210, 310, and 410. The first insulation layers 130, 230, 330, and 430 may be formed of, for example, oxides, nitrides, combinations of such materials, or the like.

Second insulation layers 150, 250, 350, and 450 that expose a part of the second pads 140, 240, 340, and 440 and cover other parts of the second pads 140, 240, 340, and 440 may be further formed on the second pads 140, 240, 340, and 440. The second insulation layers 150, 250, 350, and 450 may have open spaces that expose a part of the second pads 140, 240, 340, and 440. The open spaces may be openings, a notch shapes, or the like. The second insulation layers 150, 250, 350, and 450 may be formed of, for example, nitride, photosensitive polyimide (PSPI), or the like.

The second insulation layers 150, 250, 350, and 450 may wholly cover side surfaces of the second pads 140, 240, 340, and 440 or may expose partially the side surfaces of the second pads 140, 240, 340, and 440. The second insulation layers 150, 250, 350, and 450 may act as passivation films that expose the second pads 140, 240, 340, and 440 and cover wholly or mostly other parts of the second pads 140, 240, 340, and 440 on an uppermost surface of the semiconductor chips 100, 200, 300, and 400. Thus, the second insulation layers 150, 250, 350, and 450 may be also used as protection layers.

The second pads 140, 240, 340, and 440 may extend to be more closely adjacent to the edges of the semiconductor substrates 110, 210, 310, and 410 than the conductive patterns 124, 224, 324, and 424. The second pads 140, 240, 340, and 440 may cover wholly top surfaces of the first pads 122, 222, 322, and 422 that are exposed by the first insulation layers 130, 230, 330, and 430.

The semiconductor packages 1, 2, 3, and 4 may further include the auxiliary semiconductor chip 500. The auxiliary semiconductor chip 500 may be a semiconductor chip used to provide a controller, a buffer, a cache memory, a power device necessary for using the semiconductor chips 100, 200, 300, and 400, or the like. The auxiliary semiconductor chip 500 may be, for example, a controller chip, a DRAM, an SRAM, or an intelligent power device (IPD). The auxiliary semiconductor chip 500 may be stacked on an uppermost end of the semiconductor chips 100, 200, 300, and 400, i.e., the fourth semiconductor chip 400; however, the auxiliary semiconductor chip 500 may be disposed in other locations. The auxiliary semiconductor chip 500 may be attached onto the package base substrate 10 or may be disposed between the semiconductor chips 100, 200, 300, and 400. The auxiliary semiconductor chip 500 may be stacked on the fourth semiconductor chip 400 after an auxiliary die adhesive film 590 is attached thereto. Alternatively, the auxiliary semiconductor chip 500 may be stacked on the package base substrate 10, the first semiconductor chip 100, the second semiconductor chip 200, or the third semiconductor chip 300 after the auxiliary die adhesive film 590 is attached thereto.

The semiconductor packages 1, 2, 3, and 4 may further include the bonding wires 810 and 820. The bonding wires 810 and 820 may be formed of a metal material such as gold, silver, platinum, aluminum, copper, or the like. The bonding wires 810 and 820 may be formed of a single metal or alloy. Alternatively, the bonding wires 810 and 820 may be cores which are formed of a single metal or alloy and of which surfaces are coated with another metal or alloy.

The bonding wires 810 and 820 may include the first bonding wire 810 and the second bonding wire 820. The first bonding wire 810 may electrically connect the semiconductor chips 100, 200, 300, and 400 to the package base substrate 10. The first bonding wire 810 may connect the second pads 140, 240, 340, and 440 of the semiconductor chips 100, 200, 300, and 400 to the first top surface pad 14*a* of the package base substrate 10.

The first bonding wire 810 may be connected to the first top surface pad 14*a* of the package base substrate 10 after sequentially connecting the second pad 440 of the fourth semiconductor chip 400, the second pad 340 of the third semiconductor chip 300, the second pad 240 of the second semiconductor chip 200, and the second pad 140 of the first semiconductor chip 100. Alternatively, the first bonding wire 810 may separately connect between the second pads 140, 240, 340, and 440 of the semiconductor chips 100, 200, 300, and 400 and the first top surface pad 14*a* of the package base substrate 10.

The second bonding wire 820 may electrically connect the auxiliary semiconductor chip 500 and the package base substrate 10. The second bonding wire 820 may connect a connection pad 540 of the auxiliary semiconductor chip 500 and the second top surface pad 14*b* of the package base substrate 10.

The semiconductor packages 1, 2, 3, and 4 may further include a molding member 900. The molding member 900 may be formed on the top surface of the package base substrate 10 and may wholly surround the semiconductor chips 100, 200, 300, and 400, the auxiliary semiconductor chip 500, and the bonding wires 810 and 820. The molding member 900 may be formed of, for example, an epoxy molding compound (EMC).

The semiconductor devices 102, 202, 302, and 402 that are respectively included in the semiconductor chips 100, 200, 300, and 400 may be homogeneous or heterogeneous semiconductor devices. The semiconductor chips 100, 200, 300, and 400 may respectively include the first pads 122, 222, 322, and 422, the conductive patterns 124, 224, 324, and 424, the second pads 140, 240, 340, and 440, the first insulation layers 130, 230, 330, and 430, and the second insulation layers 150, 250, 350, and 450 that are the same or similar shapes.

The first pad 122, the conductive pattern 124, the second pad 140, the first insulation layer 130, and the second insulation layer 150 of the first semiconductor chip 100 will now be in more detail described below. Unless particularly mentioned, the descriptions of the first pad 122, the conductive pattern 124, the second pad 140, the first insulation layer 130, and the second insulation layer 150 of the first semiconductor chip 100 may apply to the first pads 222, 322, and 422, the conductive patterns 224, 324, and 424, the second pads 240, 340, and 440, the first insulation layers 230, 330, and 430, and the second insulation layers 250, 350, and 450 of the semiconductor chips 200, 300, and 400, and redundant descriptions may be omitted.

Figure 1B:
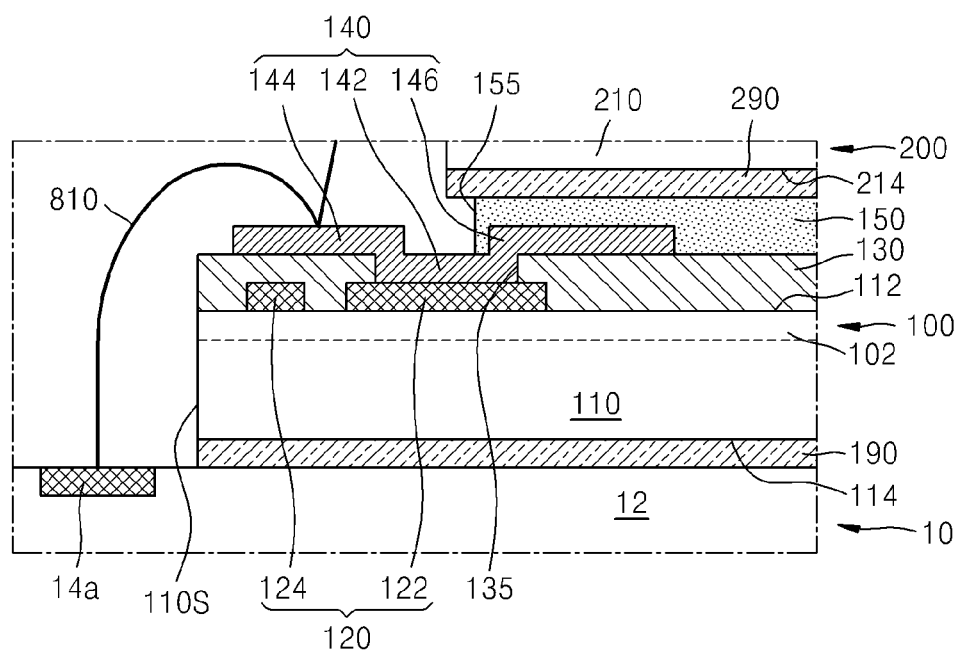

FIGS. 1A through 1B are cross-sectional views of the semiconductor package 1 according to some embodiments. In more detail, FIG. 1A is a schematic cross-sectional view of main parts of the semiconductor package 1, and FIG. 1B is a cross-sectional view of a part A of FIG. 1A.

Referring to FIGS. 1A and 1B, the first semiconductor chip 100 in which the semiconductor device 102 is formed on the active surface 112 includes the first pad 122, the conductive pattern 124, and the second pad 140. The first pad 122 may be electrically connected to the semiconductor device 102.

The conductive pattern 124 may be formed to be more closely adjacent to an edge 110S of the semiconductor substrate 110 than the first pad 122. The first pad 122 and the conductive pattern 124 may be parts of the metal wiring layer 120. The first pad 122 and the conductive pattern 124 may have the same level as that of the semiconductor substrate 110.

The first insulation layer 130 that has an opening 135 exposing a part of the first pad 122 and covers the conductive pattern 124 may be formed on the first pad 122 and the conductive pattern 124. The first insulation layer 130 may entirely cover a top surface of the conductive pattern 124. The first insulation layer 130 may cover a part of an edge of the first pad 122 and expose a center of the first pad 122. The first pad 122 may be exposed through the opening 135 of the first insulation layer 130.

The second pad 140 connected to the first pad 122 may be formed on the first pad 122. The second pad 140 may extend onto the conductive pattern 124 from the first pad 122. The second pad 140 may contact the top surface of the first pad 122 exposed by the opening 135 and may be spaced apart from the conductive pattern 124. The second pad 140 may contact the top surface of the first pad 122 in the opening 135 and may extend onto the first insulation layer 130 from the top surface of the first pad 122. The second pad 140 may entirely cover a part of the first pad 122, i.e., a part of the first pad 122 exposed through the opening 135, exposed by the first insulation layer 130. The second pad 140 may be spaced apart from the conductive pattern 124 having the first insulation layer 130 interposed between the second pad 140 and the conductive pattern 124 and may extend over the conductive pattern 124. The second pad 140 may extend to be more closely adjacent to the edge 110S of the semiconductor substrate 110 than the conductive pattern 124.

The second pad 140 may include a base portion 142 contacting the first pad 122 and extension portions 144 and 146 formed on the first insulation layer 130. The second pad 140 may extend and be connected from the base portion 142 and the extension portions 144 and 146 along an inner wall of the opening 135. The second pad 140 may have a step difference between the base portion 142 and the extension portions 144 and 146. The step difference between the base portion 142 and the extension portions 144 and 146 may be the same as or similar to a height of the inner wall of the opening 135.

The extension portions 144 and 146 of the second pad 140 may include the first extension portion 144 and the second extension portion 146. The first extension portion 144 of the extension portions 144 and 146 of the second pad 140 is a portion extending in the edge 110S of the semiconductor substrate 110 from the base portion 142. The second extension portion 146 of the extension portions 144 and 146 of the second pad 140 is a portion extending in a direction opposite to the edge 110S of the semiconductor substrate 110 from the opening 135.

The extension portions 144 and 146 of the second pad 140, in particular, the first extension portion 144, may extend to be adjacent to and spaced apart from the edge 110S of the semiconductor substrate 110. The first extension portion 144 may extend to be more closely adjacent to the edge 110S of the semiconductor substrate 110 than the conductive pattern 124.

The second insulation layer 150 may be formed to expose a part of the second pad 140 and to cover other parts of the second pad 140. The second insulation layer 150 may expose a part of the base portion 142 of the second pad 140 and a part of the extension portions 144 and 146. The second insulation layer 150 may have an open space 155 through which a part of the second pad 140 may be exposed. The first extension portion 144 of the second pad 140 may be exposed through the open space 155. A part of the base portion 142 of the second pad 140 may be exposed through the open space 155, and other part thereof may be covered by the second insulation layer 150. The second extension portion 146 of the second pad 140 may be covered by the second insulation layer 150. Alternatively, the second insulation layer 150 may be formed to expose the base portion 142 and the first extension portion 144 of the second pad 140 and to expose a part of the second extension portion 146 and cover another part thereof. The open space 155 may have a notch shape or other shape that exposes the particular portions of the second pad 140. That is, the open space 155 may be a space extending from the edge 110S of the semiconductor substrate 110. Thus, the second insulation layer 150 may also expose parts of side surfaces of the second pad 140. That is, the second insulation layer 150 may expose the side surfaces of the second pad 140 facing the edge 110S of the semiconductor substrate 110.

The second semiconductor chip 200 may be attached onto the first semiconductor chip 100 after the die adhesive film 290 is attached thereto. The second semiconductor chip 200 may be shifted from the edge 110S of the first semiconductor chip 100 and may be stacked on the first semiconductor chip 100 such that the first extension portion 144 of the first semiconductor chip 100 is exposed and at least a part of the base 142 is hidden in a vertical direction to a main surface of the package base substrate 10.

The second semiconductor chip 200 to which the die adhesive film 290 is attached may be formed on the second insulation layer 150. A top surface of the second insulation layer 150 may be entirely covered and side surfaces of the second insulation layer 150 may be exposed by the second semiconductor chip 200 to which the die adhesive film 290 is attached. The second semiconductor chip 200 may be more closely adjacent to the edge 110S of the semiconductor substrate 110 than the second insulation layer 150 while a bottom surface of the die adhesive film 290 may be partially exposed by the second insulation layer 150. However, in other embodiments, the second insulation layer 150 and the die adhesive film 290 may be in different positions. The second insulation layer 150 and the second semiconductor chip 200 may be adjacent to the edge 110S of the semiconductor substrate 110 by a similar gap or, the second insulation layer 150 may be more closely adjacent to the edge 110S of the semiconductor substrate 110 than the second semiconductor chip 200. This will be described later with reference to FIGS. 25A and 25B.

When the second semiconductor chip 200 is positioned over the base portion 142 of the first semiconductor chip 100 and the second insulation layer 150 hides at least a part of the base portion 142 of the first semiconductor chip 100, the second semiconductor chip 200 may be supported by the second insulation layer 150.

The first bonding wire 810 may connect the first extension portion 144 of the second pad 140 and the first top surface pad 14a and may electrically connect the first semiconductor chip 100 and the package base substrate 10.

When the semiconductor package 1 according to an embodiment includes the conductive pattern 124 that is more closely adjacent to the edge 110S of the semiconductor substrate 110 than the first pad 122 in view of the design of the first semiconductor chip 100, the first bonding wire 810 may be connected to the second pad 140. The first extension portion 144 of the second pad 140 may be more closely adjacent to the edge 110S of the semiconductor substrate 110 than the first pad 122. The first extension portion 144 of the second pad 140 may be more closely adjacent to the edge 110S of the semiconductor substrate 110 than the conductive pattern 124.

If the first bonding wire 810 is connected to the first extension portion 144 of the second pad 140, the second semiconductor chip 200 may be shifted by a predetermined distance in a first direction that is horizontal with respect to the main surface of the package base substrate 10 and may be stacked on the first semiconductor chip 100 in such a way that at least a part of the base portion 142 of the second pad 140 is hidden in the vertical direction with respect to the main surface of the package base substrate 10. That is, the second semiconductor chip 200 may hide at least a part of the first pad 122 in the vertical direction with respect to the main surface of the package base substrate 10.

If the first bonding wire 810 is connected to the second pad 140, in particular, the first extension portion 144 of the second pad 140, the distance by which the second semiconductor chip 200 is shifted in the first direction may be reduced compared to a case where the first bonding wire 810 is connected to the first pad 122.

The third semiconductor chip 300 stacked on the second semiconductor chip 200 and the fourth semiconductor chip 400 stacked on the third semiconductor chip 300 may have a similar spatial relationship as that of the second semiconductor chip 200 stacked on the first semiconductor chip 100, and thus descriptions thereof are omitted here.

Therefore, when the semiconductor chips 100, 200, 300, and 400 are stacked on the package base substrate 10, since distances by which the second through fourth semiconductor chips 200, 300, and 400 stacked on the first semiconductor chip 100 are shifted in the first direction are reduced, an area of the semiconductor package 1 may be reduced, and thus a volume of the semiconductor package 1 may be reduced.

Figure 2A:
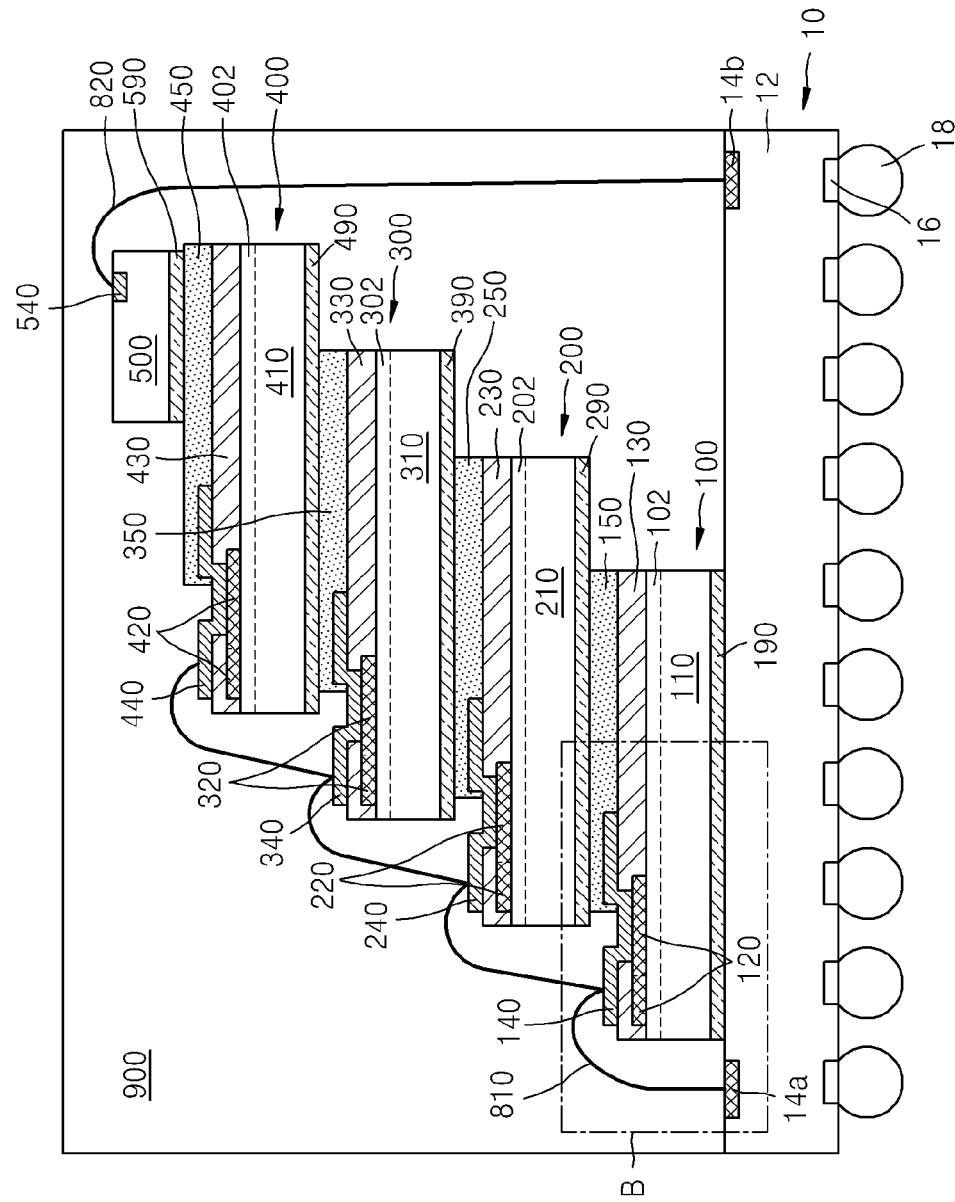
Figure 2B:
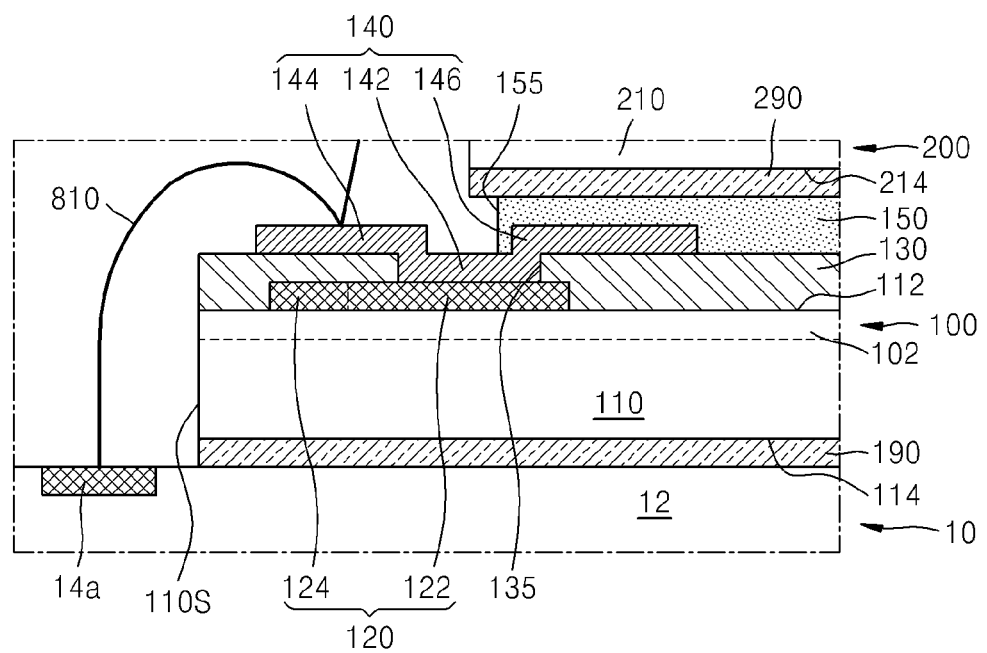

FIGS. 2A through 2B are cross-sectional views of the semiconductor package 2 according to some embodiments. In more detail, FIG. 2A is a schematic cross-sectional view of main parts of the semiconductor package 2, and FIG. 2B is a cross-sectional view of a part B of FIG. 2A. Redundant descriptions between FIGS. 1A through 1B and FIGS. 2A through 2B may be omitted.

Referring to FIGS. 2A and 2B, the first semiconductor chip 100 in which the semiconductor device 102 is formed on the active surface 112 includes the first pad 122, the conductive pattern 124, and the second pad 140. The first pad 122 may be electrically connected to the semiconductor device 102.

The conductive pattern 124 may be formed to be more closely adjacent to the edge 110S of the semiconductor substrate 110 than the first pad 122. The first pad 122 and the conductive pattern 124 may be parts of the metal wiring layer 120. The first pad 122 and the conductive pattern 124 may be integrally formed. The conductive pattern 124 may be a part of the metal wiring layer 120 that extends from the first pad 122 towards the edge 110S of the semiconductor substrate 110.

The first insulation layer 130 that has the opening 135 exposing a part of the first pad 122 and covers the conductive pattern 124 may be formed on the first pad 122 and the conductive pattern 124. The first insulation layer 130 may entirely cover a top surface of the conductive pattern 124.

The second pad 140 connected to the first pad 122 may be formed on the first pad 122. The second pad 140 may extend over the conductive pattern 124 from the first pad 122. The second pad 140 may contact the top surface of the first pad 122 exposed by the opening 135 and may be spaced apart from the conductive pattern 124. The second pad 140 may contact the top surface of the first pad 122 in the opening 135 and may extend onto the first insulation layer 130 from the top surface of the first pad 122. The second pad 140 may be spaced apart from the conductive pattern 124 having the first insulation layer 130 interposed between the second pad 140 and the conductive pattern 124 and may extend over the conductive pattern 124. The second pad 140 may extend to be more closely adjacent to the edge 110S of the semiconductor substrate 110 than the conductive pattern 124.

The second pad 140 may include the base portion 142 contacting the first pad 122 and the extension portions 144 and 146 formed on the first insulation layer 130. The extension portions 144 and 146 of the second pad 140 may include the first extension portion 144 and the second extension portion 146. The first extension portion 144 may extend to be more closely adjacent to the edge 110S of the semiconductor substrate 110 than the conductive pattern 124.

When the semiconductor package 2 according to an embodiment includes the conductive pattern 124 that extends from the first pad 122 to the edge 110S of the semiconductor chip 100 in view of the design of the first semiconductor chip 100, the first bonding wire 810 may be connected to the second pad 140.

Therefore, when the semiconductor chips 100, 200, 300, and 400 are stacked on the package base substrate 10, since distances by which the second through fourth semiconductor chips 200, 300, and 400 stacked on the first semiconductor chip 100 are shifted in a first direction that is parallel with respect to a main surface of the package base substrate 10 are reduced, an area of the semiconductor package 2 may be reduced, and thus a volume of the semiconductor package 2 may be reduced.

Figure 3A:
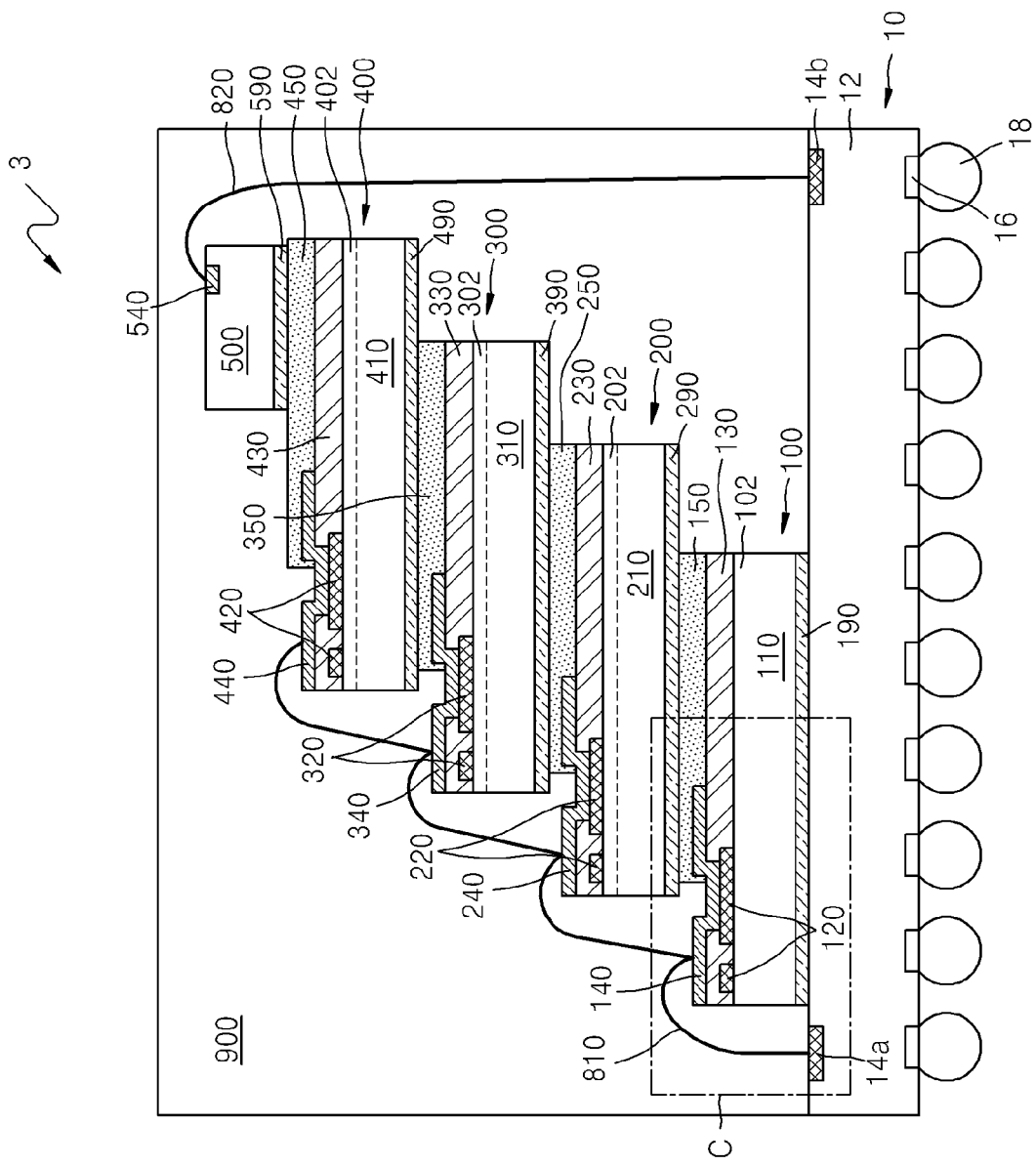
Figure 3B:
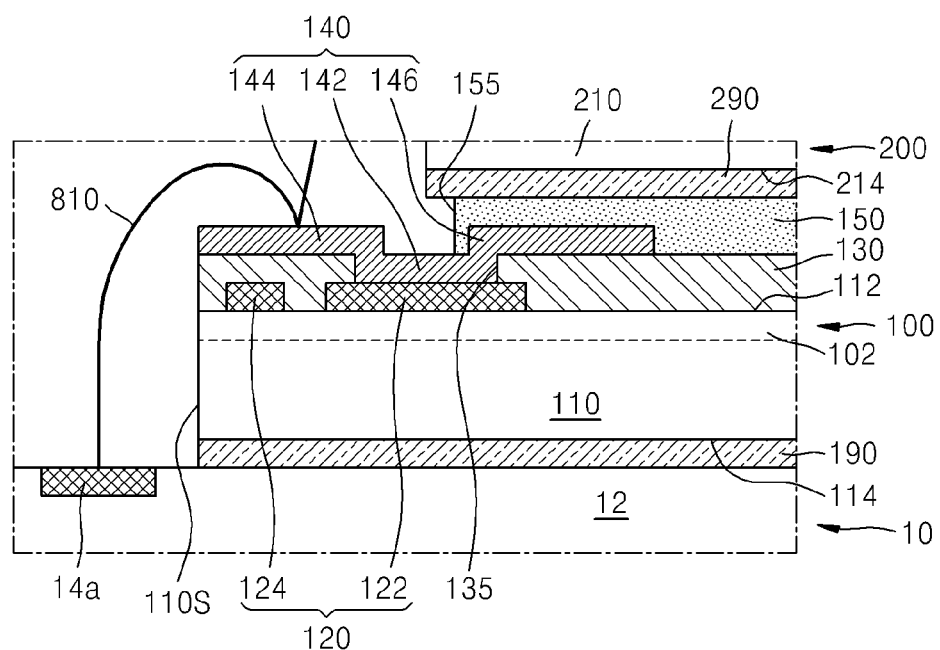

FIGS. 3A through 3B are cross-sectional views of the semiconductor package 3 according to some embodiments. In more detail, FIG. 3A is a schematic cross-sectional view of main parts of the semiconductor package 3, and FIG. 3B is a cross-sectional view of a part C of FIG. 3A. Redundant descriptions between FIGS. 1A through 1B and FIGS. 3A through 3B may be omitted.

Referring to FIGS. 3A and 3B, the first semiconductor chip 100 in which the semiconductor device 102 is formed on the active surface 112 includes the first pad 122, the conductive pattern 124, and the second pad 140. The first pad 122 may be electrically connected to the semiconductor device 102.

The conductive pattern 124 may be formed to be more closely adjacent to an edge 110S of the semiconductor substrate 110 than the first pad 122. The first pad 122 and the conductive pattern 124 may be parts of the metal wiring layer 120. The first pad 122 and the conductive pattern 124 may have the same level as that of the semiconductor substrate 110.

The first insulation layer 130 that has the opening 135 exposing a part of the first pad 122 and covers the conductive pattern 124 may be formed on the first pad 122 and the conductive pattern 124. The first insulation layer 130 may entirely cover a top surface of the conductive pattern 124.

The second pad 140 connected to the first pad 122 may be formed on the first pad 122. The second pad 140 may extend over the conductive pattern 124 from the first pad 122. The second pad 140 may contact the top surface of the first pad 122 exposed by the opening 135 and may be spaced apart from the conductive pattern 124. The second pad 140 may contact the top surface of the first pad 122 in the opening 135 and may extend onto the first insulation layer 130 from the top surface of the first pad 122. The second pad 140 may be spaced apart from the conductive pattern 124 having the first insulation layer 130 interposed between the second pad 140 and the conductive pattern 124 and may extend over the conductive pattern 124. The second pad 140 may extend to the edge 110S of the semiconductor substrate 110.

The second pad 140 may include the base portion 142 contacting the first pad 122 and the extension portions 144 and 146 formed on the first insulation layer 130. The extension portions 144 and 146 of the second pad 140 may include the first extension portion 144 and the second extension portion 146. The first extension portion 144 may extend to the edge 110S of the semiconductor substrate 110.

When the semiconductor package 3 according to an embodiment includes the conductive pattern 124 that extends from the first pad 122 towards the edge 110S of the semiconductor substrate 110 in view of the design of the first semiconductor chip 100, the first bonding wire 810 may be connected to the second pad 140 that extends to the edge 110S of the semiconductor substrate 110.

Therefore, when the semiconductor chips 100, 200, 300, and 400 are stacked on the package base substrate 10, since distances by which the second through fourth semiconductor chips 200, 300, and 400 stacked on the first semiconductor chip 100 are shifted in a first direction that is parallel with respect to a main surface of the package base substrate 10 are reduced, an area of the semiconductor package 3 may be reduced, and thus a volume of the semiconductor package 3 may be reduced.

Figure 4A:
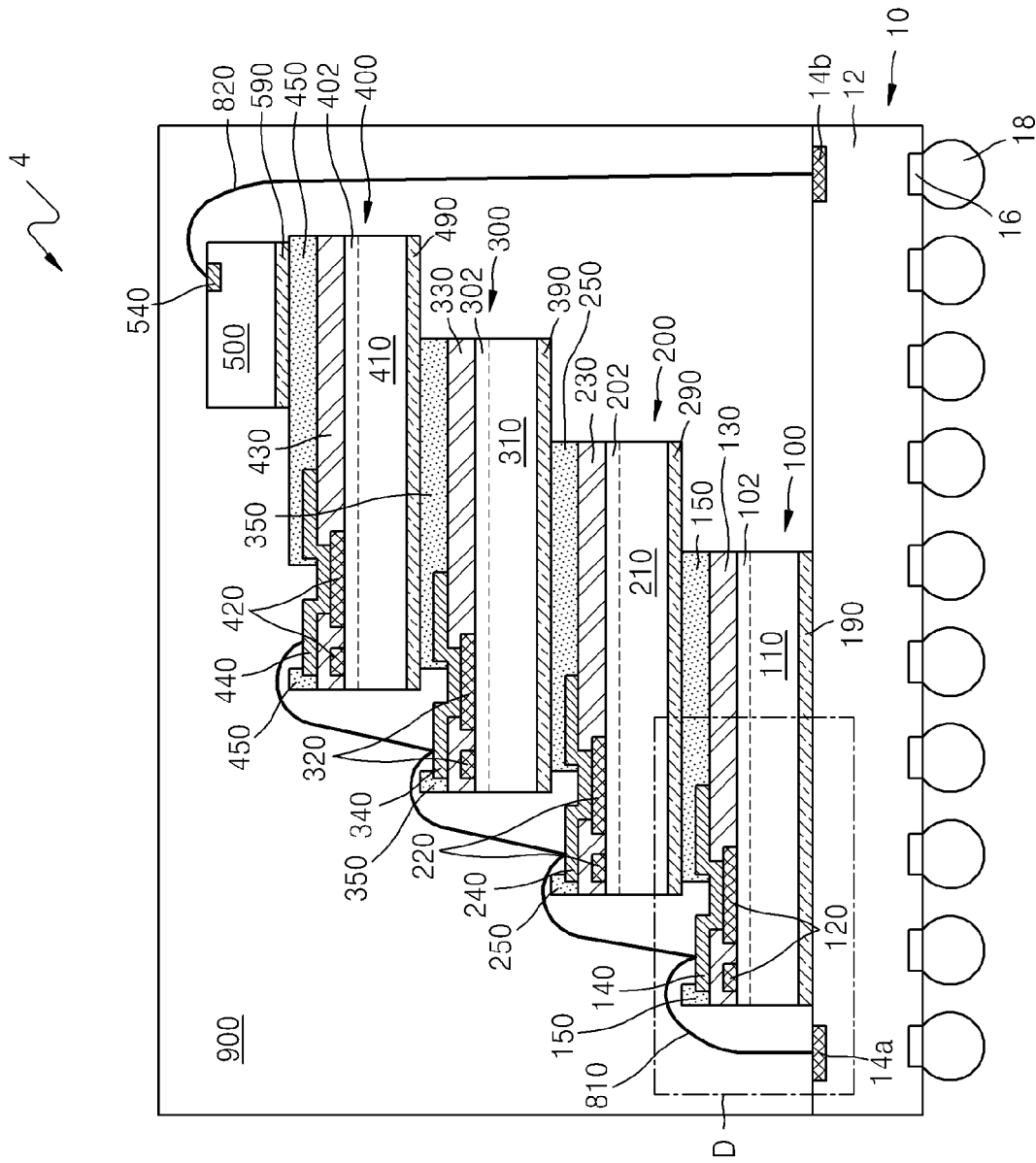
Figure 4B:
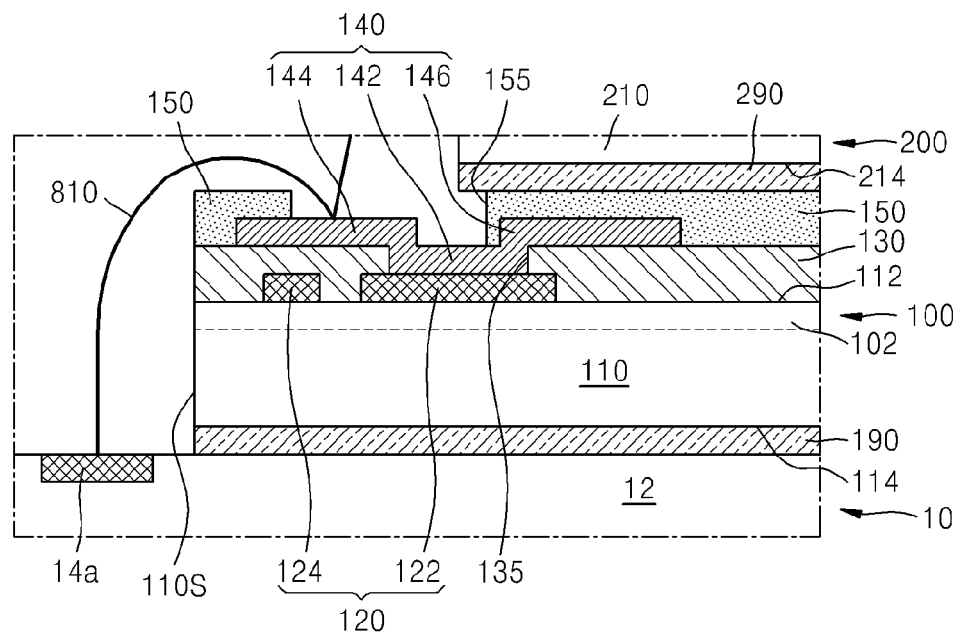

FIGS. 4A through 4B are cross-sectional views of the semiconductor package 4 according to some embodiments. In more detail, FIG. 4A is a schematic cross-sectional view of main parts of the semiconductor package 4, and FIG. 4B is a cross-sectional view of a part D of FIG. 4A. Redundant descriptions between FIGS. 1A through 1B and FIGS. 4A through 4B may be omitted.

Referring to FIGS. 4A and 4B, the first semiconductor chip 100 in which the semiconductor device 102 is formed on the active surface 112 includes the first pad 122, the conductive pattern 124, and the second pad 140. The first pad 122 may be electrically connected to the semiconductor device 102.

The conductive pattern 124 may be formed to be more closely adjacent to the edge 110S of the semiconductor substrate 110 than the first pad 122. The first pad 122 and the conductive pattern 124 may be parts of the metal wiring layer 120. The first pad 122 and the conductive pattern 124 may be integrally formed.

The first insulation layer 130 that has the opening 135 exposing a part of the first pad 122 and covers the conductive pattern 124 may be formed on the first pad 122 and the conductive pattern 124. The first insulation layer 130 may entirely cover a top surface of the conductive pattern 124.

The second pad 140 connected to the first pad 122 may be formed on the first pad 122. The second pad 140 may extend over the conductive pattern 124 from the first pad 122. The second pad 140 may contact the top surface of the first pad 122 in the opening 135 and may extend onto the first insulation layer 130 from the top surface of the first pad 122. The second pad 140 may be spaced apart from the conductive pattern 124 having the first insulation layer 130 interposed between the second pad 140 and the conductive pattern 124 and may extend onto the conductive pattern 124. The second pad 140 may extend to be more closely adjacent to the edge 110S of the semiconductor substrate 110 than the conductive pattern 124.

The second insulation layer 150 may be formed to expose a part of the second pad 140 and to cover other parts of the second pad 140. The second insulation layer 150 may expose a part of the base portion 142 of the second pad 140 and a part of the extension portions 144 and 146. The second insulation layer 150 may have the open space 155 through which a part of the second pad 140 may be exposed. The first extension portion 144 of the second pad 140 may be exposed through the open space 155. A part of the base portion 142 of the second pad 140 may be exposed through the open space 155, and another part thereof may be covered by the second insulation layer 150. The second extension portion 146 of the second pad 140 may be covered by the second insulation layer 150. Alternatively, the second insulation layer 150 may be formed to expose the base portion 142 and the first extension portion 144 of the second pad 140 and to expose a part of the second extension portion 146 and cover another part thereof. The open space 155 may have an opening shape. That is, the open space 155 may be a space extending from the edge 110S of the semiconductor substrate 110. Thus, the second insulation layer 150 may entirely cover side surfaces of the second pad 140.

When the semiconductor package 4 according to an embodiment includes the conductive pattern 124 that extends from the first pad 122 towards the edge 110S of the semiconductor chip 100 in view of the design of the first semiconductor chip 100, the first bonding wire 810 may be connected to the second pad 140.

Therefore, when the semiconductor chips 100, 200, 300, and 400 are stacked on the package base substrate 10, since distances by which the second through fourth semiconductor chips 200, 300, and 400 stacked on the first semiconductor chip 100 are shifted in a first direction that is a perpendicular direction with respect to a main surface of the package base substrate 10 are reduced, an area of the semiconductor package 4 may be reduced, and thus a volume of the semiconductor package 4 may be reduced.

FIGS. 5 through 12 are plan layout views of the first pad 122 and the second pad 140 of the first semiconductor chip 100 included in a semiconductor package according to some embodiments.

Figure 5:
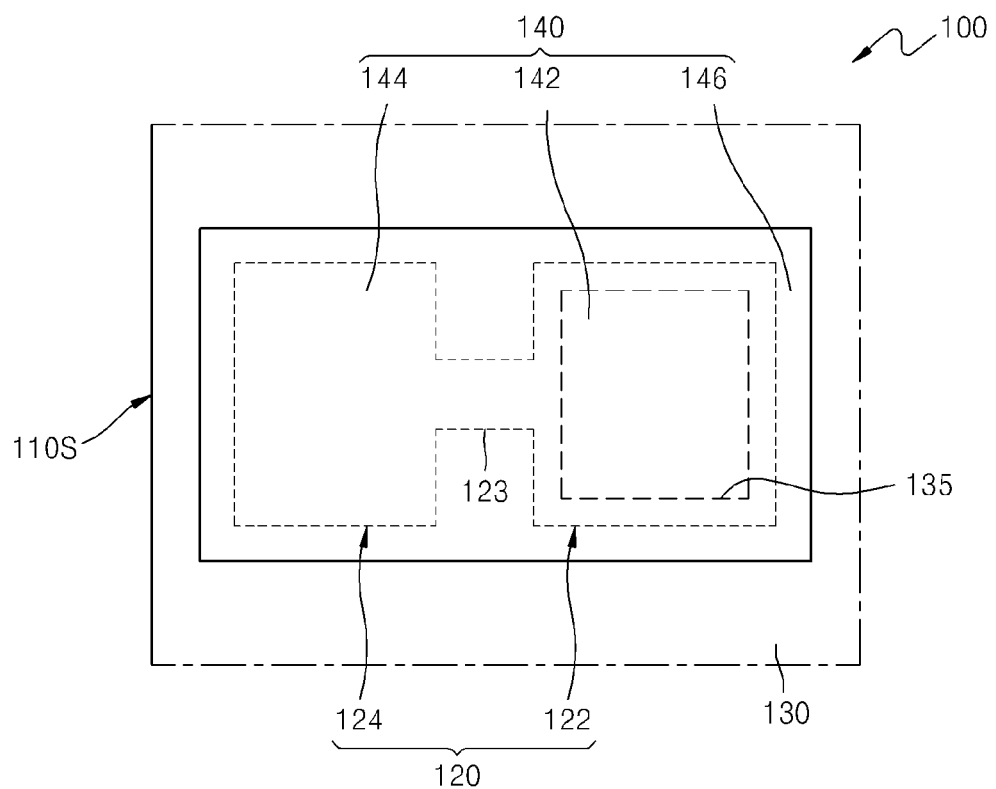
FIGS. 5 through 12 are plan layout views of a first pad and a second pad of a semiconductor chip included in a semiconductor package according to some embodiments.

Referring to FIG. 5, the first semiconductor chip 100 includes the first pad 122, the conductive pattern 124, and the second pad 140. The conductive pattern 124 may be formed to be more closely adjacent to the edge 110S of a semiconductor substrate than the first pad 122. The first pad 122 and the conductive pattern 124 may be parts of the metal wiring layers 120. The first pad 122 and the conductive pattern 124 may be integrally formed. That is, the conductive pattern 124 may be a part of the metal wiring layer 120 extending from the first pad 122 to the edge 110S of the semiconductor substrate.

The first insulation layer 130 that has the opening 135 exposing a part of the first pad 122 and covers the conductive pattern 124 may be formed on the first pad 122 and the conductive pattern 124. The first insulation layer 130 may entirely cover a top surface of the conductive pattern 124. The first insulation layer 130 may wholly cover parts of the first pad 122 adjacent to an edge of the first pad 122 and expose a center of the first pad 122. The first pad 122 may be exposed through the opening 135 of the first insulation layer 130.

The second pad 140 connected to the first pad 122 may be formed on the first pad 122. The second pad 140 may extend from the first pad 122 to the conductive pattern 124. The second pad 140 may contact a top surface of the first pad 122 exposed through the opening 135 and may be spaced apart from the conductive pattern 124. The second pad 140 may contact the top surface of the first pad 122 in the opening 135 and may extend from the top surface of the first pad 122 to the first insulation layer 130. The second pad 140 may entirely cover a part of the first pad 122 exposed by the first insulation layer 130, i.e., a part of the first pad 122 exposed through the opening 135. The second pad 140 may be spaced apart from the conductive pattern 124 having the first insulation layer 130 interposed between the second pad 140 and the conductive pattern 124 and may extend onto the conductive pattern 124. The second pad 140 may be more closely adjacent to the edge 110S of the semiconductor substrate than the conductive pattern 124.

The second pad 140 may include the base portion 142 contacting the first pad 122 and the extension portions 144 and 146 formed on the first insulation layer 130. The second pad 140 may extend and be connected from the base portion 142 to the extension portions 144 and 146 along an inner wall of the opening 135. The second pad 140 may have a step difference between the base portion 142 and the extension portions 144 and 146. The step difference between the base portion 142 and the extension portions 144 and 146 may be the same as or similar to a height of the inner wall of the opening 135.

The extension portions 144 and 146 of the second pad 140 may include the first extension portion 144 and the second extension portion 146. The first extension portion 144 is a portion extending in the edge 110S of the semiconductor substrate 110 from the base portion 142 between the extension portions 144 and 146 of the second pad 140. The second extension portion 146 is a portion extending in a direction opposite to the edge 110S of the semiconductor substrate 110 from the opening 135 between the extension portions 144 and 146 of the second pad 140.

The extension portions 144 and 146 of the second pad 140, in particular, the first extension portion 144, may extend to be adjacent to and spaced apart from the edge 110S of the semiconductor substrate 110. The first extension portion 144 may extend to be more closely adjacent to the edge 110S of the semiconductor substrate 110 than the conductive pattern 124.

The second pad 140 may further include a portion 123 that connects the first extension portion 144 and the second extension portion 146 and surrounds the base portion 142.

Figure 6:
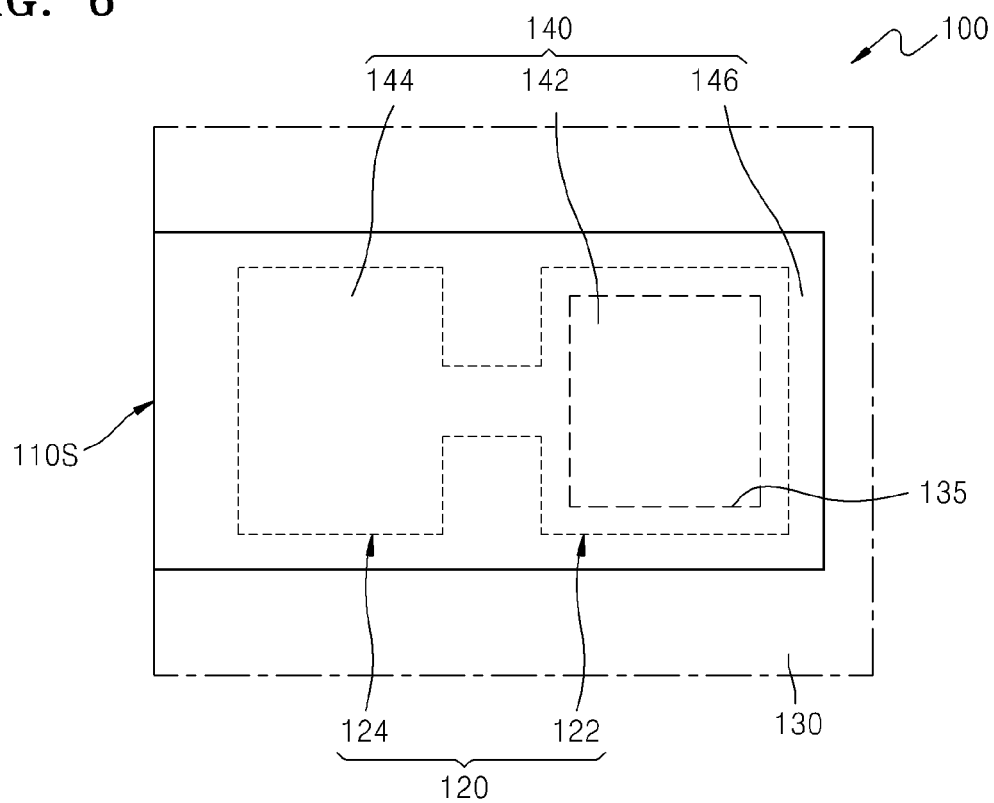

Referring to FIG. 6, the second pad 140 may extend to the edge 110S of the semiconductor substrate 110. The second pad 140 of the first semiconductor chip 100 of FIG. 5 extends to be adjacent to and spaced apart from the edge 110S of the semiconductor substrate 110, whereas the second pad 140 of the first semiconductor chip 100 of FIG. 6 extends to the edge 110S of the semiconductor substrate 110. A redundant description of the second pad 140 of FIGS. 5 and 6 is omitted here.

The second pad 140 may include the base portion 142 contacting the first pad 122 and the extension portions 144 and 146 formed on the first insulation layer 130. The extension portions 144 and 146 of the second pad 140 may include the first extension portion 144 and the second extension portion 146. The first extension portion 144 may extend to the edge 110S of the semiconductor substrate 110.

The first extension portion 144 is a portion extending to the edge 110S of the semiconductor substrate 110 from the base portion 142 between the extension portions 144 and 146 of the second pad 140. The second extension portion 146 is a portion extending in a direction opposite to the edge 110S of the semiconductor substrate 110 from the opening 135 between the extension portions 144 and 146 of the second pad 140.

Figure 7:
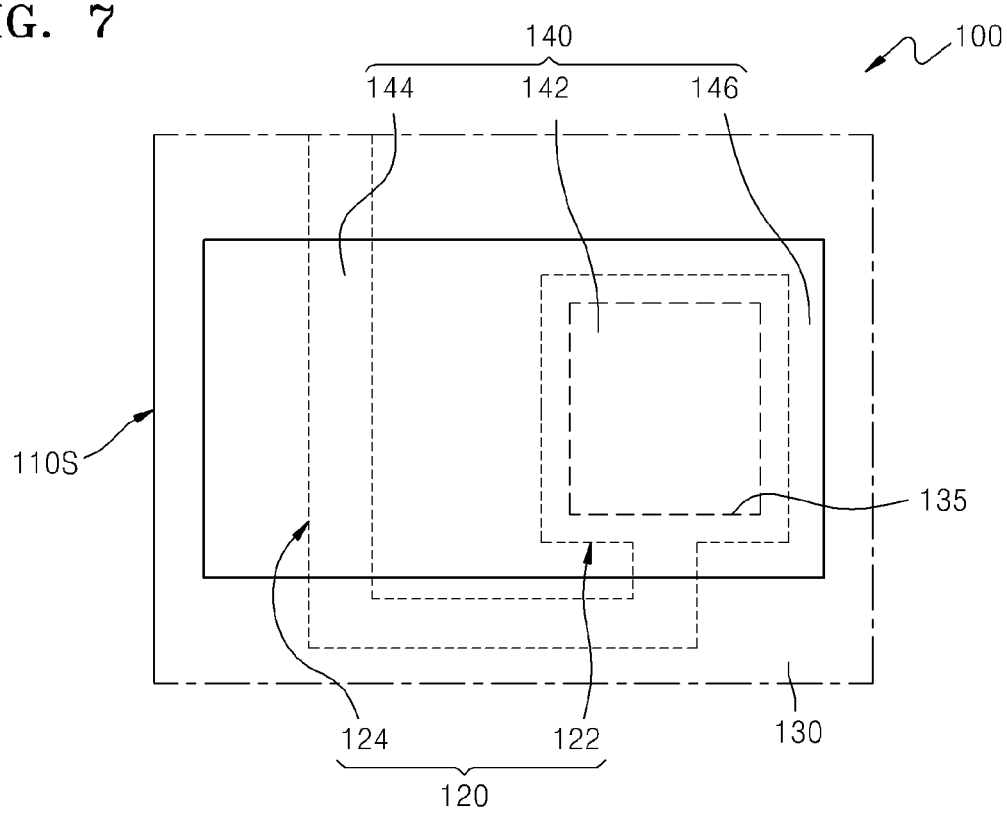

Referring to FIG. 7, the first semiconductor chip 100 includes the first pad 122, the conductive pattern 124, and the second pad 140. The conductive pattern 124 may be formed to be more closely adjacent to the edge 110S of the semiconductor substrate 110 than the first pad 122. The first pad 122 and the conductive pattern 124 may be parts of the metal wiring layer 120. The first pad 122 and the conductive pattern 124 may be integrally formed. The conductive pattern 124 may extend from the first pad 122, may be adjacent to the edge 110S of the semiconductor substrate 110, and may be a line pattern that is a part of the metal wiring layer 120 extending along the edge 110S of the semiconductor substrate 110.

The first insulation layer 130 that has the opening 135 exposing a part of the first pad 122 and covers the conductive pattern 124 may be formed on the first pad 122 and the conductive pattern 124. The first insulation layer 130 may entirely cover a top surface of the conductive pattern 124. The first insulation layer 130 may cover parts of an edge of the first pad 122 and expose a center of the first pad 122. The first pad 122 may be exposed through the opening 135 of the first insulation layer 130.

The second pad 140 connected to the first pad 122 may be formed on the first pad 122. The second pad 140 may extend over the conductive pattern 124 from the first pad 122. The second pad 140 may contact the top surface of the first pad 122 exposed by the opening 135 and may be spaced apart from the conductive pattern 124. The second pad 140 may contact the top surface of the first pad 122 in the opening 135 and may extend onto the first insulation layer 130 from the top surface of the first pad 122. The second pad 140 may entirely cover a part of the first pad 122, i.e., a part of the first pad 122 exposed through the opening 135, exposed by the first insulation layer 130. The second pad 140 may be spaced apart from the conductive pattern 124 having the first insulation layer 130 interposed between the second pad 140 and the conductive pattern 124 and may extend onto the conductive pattern 124. The second pad 140 may extend to be more closely adjacent to the edge 110S of the semiconductor substrate 110 than the conductive pattern 124.

The second pad 140 may include the base portion 142 contacting the first pad 122 and extension portions 144 and 146 formed on the first insulation layer 130. The extension portions 144 and 146 of the second pad 140 may include the first extension portion 144 and the second extension portion 146. The first extension portion 144 may extend to be more closely adjacent to the edge 110S of the semiconductor substrate 110 than the conductive pattern 124.

The first extension portion 144 is a portion extending towards the edge 110S of the semiconductor substrate 110 from the base portion 142 between the extension portions 144 and 146 of the second pad 140. The second extension portion 146 is a portion extending in a direction opposite to the edge 110S of the semiconductor substrate 110 from the opening 135 between the extension portions 144 and 146 of the second pad 140.

Figure 8:
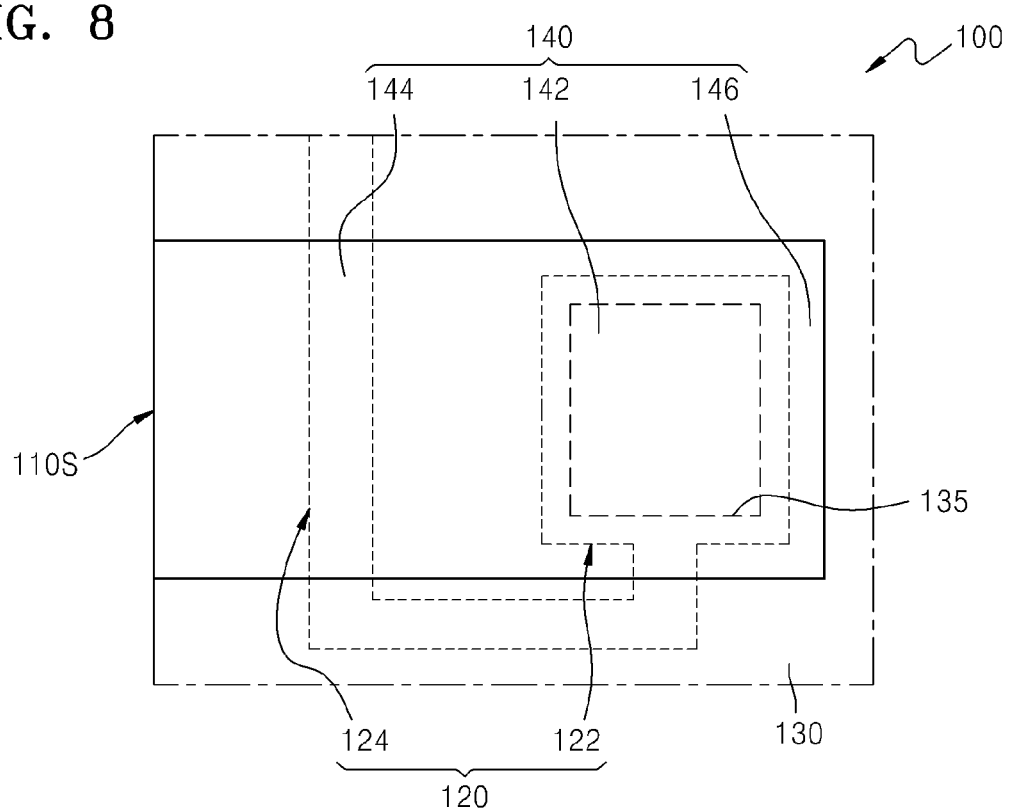

Referring to FIG. 8, the second pad 140 may extend to the edge 110S of the semiconductor substrate 110. The second pad 140 of the first semiconductor chip 100 of FIG. 7 extends to be adjacent to and spaced apart from the edge 110S of the semiconductor substrate 110, whereas the second pad 140 of the first semiconductor chip 100 of FIG. 8 extends to the edge 110S of the semiconductor substrate 110. A redundant description of the second pad 140 of FIGS. 7 and 8 is omitted here.

The second pad 140 may include the base portion 142 contacting the first pad 122 and the extension portions 144 and 146 formed on the first insulation layer 130. The extension portions 144 and 146 of the second pad 140 may include the first extension portion 144 and the second extension portion 146. The first extension portion 144 may extend to the edge 110S of the semiconductor substrate 110.

The first extension portion 144 is a portion extending to the edge 110S of the semiconductor substrate 110 from the base portion 142 between the extension portions 144 and 146 of the second pad 140. The second extension portion 146 is a portion extending in a direction opposite to the edge 110S of the semiconductor substrate 110 from the opening 135 between the extension portions 144 and 146 of the second pad 140.

Figure 9:
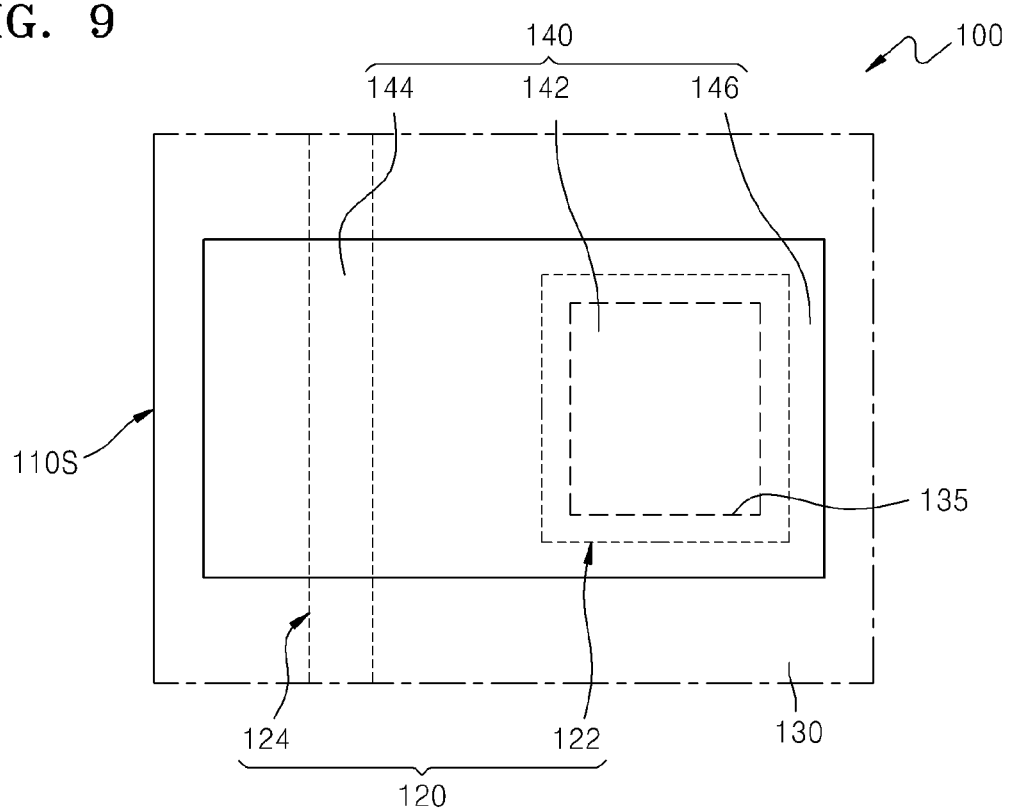

Referring to FIG. 9, the first semiconductor chip 100 includes the first pad 122, the conductive pattern 124, and the second pad 140. The conductive pattern 124 may be formed to be more closely adjacent to the edge 110S of the semiconductor substrate 110 than the first pad 122. The first pad 122 and the conductive pattern 124 may be parts of the metal wiring layer 120. The first pad 122 and the conductive pattern 124 may have the same level. The conductive pattern 124 may be physically separated from the first pad 122, may be adjacent to the edge 110S of the semiconductor substrate 110, and may be a line pattern that is a part of the metal wiring layer 120 extending along the edge 110S of the semiconductor substrate 110.

The first insulation layer 130 that has the opening 135 exposing a part of the first pad 122 and covers the conductive pattern 124 may be formed on the first pad 122 and the conductive pattern 124. The first insulation layer 130 may entirely cover a top surface of the conductive pattern 124. The first insulation layer 130 may cover parts of an edge of the first pad 122 and expose a center of the first pad 122. The first pad 122 may be exposed through the opening 135 of the first insulation layer 130.

The second pad 140 connected to the first pad 122 may be formed on the first pad 122. The second pad 140 may extend over the conductive pattern 124 from the first pad 122. The second pad 140 may contact the top surface of the first pad 122 exposed by the opening 135 and may be spaced apart from the conductive pattern 124. The second pad 140 may contact the top surface of the first pad 122 in the opening 135 and may extend onto the first insulation layer 130 from the top surface of the first pad 122. The second pad 140 may entirely cover a part of the first pad 122, i.e., a part of the first pad 122 exposed through the opening 135, exposed by the first insulation layer 130. The second pad 140 may be spaced apart from the conductive pattern 124 having the first insulation layer 130 interposed between the second pad 140 and the conductive pattern 124 and may extend onto the conductive pattern 124. The second pad 140 may extend to be more closely adjacent to the edge 110S of the semiconductor substrate 110 than the conductive pattern 124.

The second pad 140 may include the base portion 142 contacting the first pad 122 and extension portions 144 and 146 formed on the first insulation layer 130. The extension portions 144 and 146 of the second pad 140 may include the first extension portion 144 and the second extension portion 146. The first extension portion 144 may extend to be more closely adjacent to the edge 110S of the semiconductor substrate 110 than the conductive pattern 124.

The first extension portion 144 is a portion extending towards the edge 110S of the semiconductor substrate 110 from the base portion 142 between the extension portions 144 and 146 of the second pad 140. The second extension portion 146 is a portion extending in a direction opposite to the edge 110S of the semiconductor substrate 110 from the opening 135 between the extension portions 144 and 146 of the second pad 140.

Figure 10:
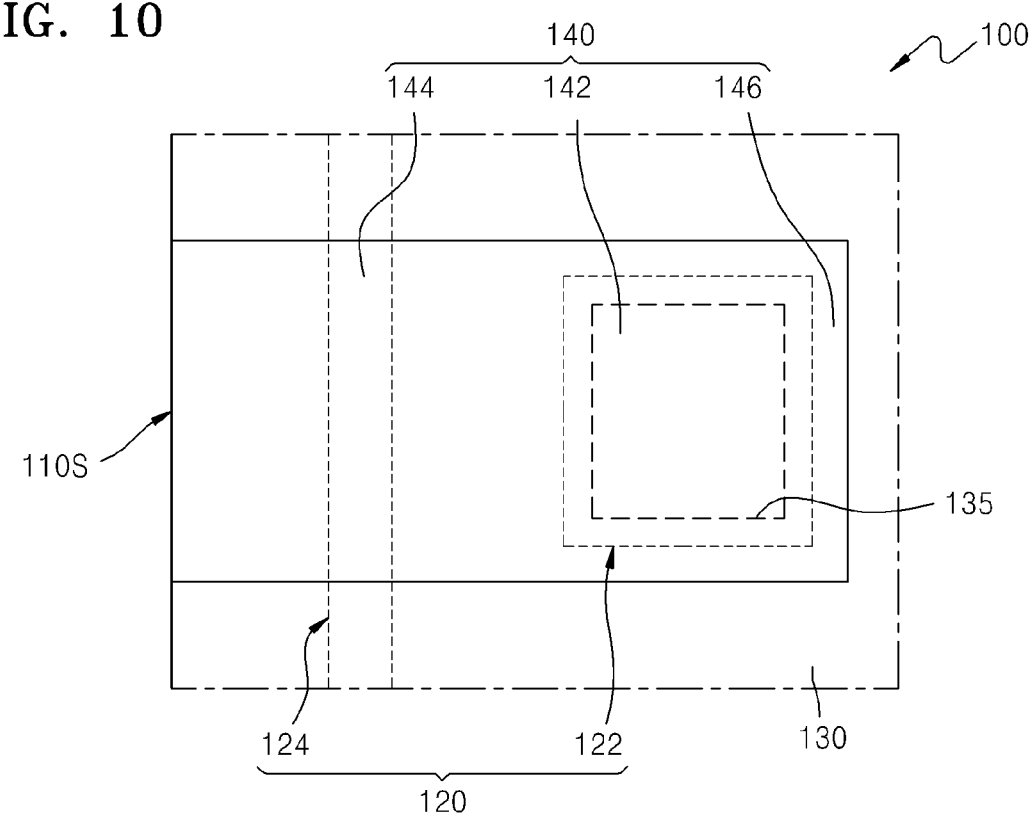

Referring to FIG. 10, the second pad 140 may extend to the edge 110S of the semiconductor substrate 110. The second pad 140 of the first semiconductor chip 100 of FIG. 9 extends to be adjacent to and spaced apart from the edge 110S of the semiconductor substrate 110, whereas the second pad 140 of the first semiconductor chip 100 of FIG. 10 extends to the edge 110S of the semiconductor substrate 110. A redundant description of the second pad 140 of FIGS. 9 and 10 is omitted here.

The second pad 140 may include the base portion 142 contacting the first pad 122 and the extension portions 144 and 146 formed on the first insulation layer 130. The extension portions 144 and 146 of the second pad 140 may include the first extension portion 144 and the second extension portion 146. The first extension portion 144 may extend to the edge 110S of the semiconductor substrate 110.

The first extension portion 144 is a portion extending to the edge 110S of the semiconductor substrate 110 from the base portion 142 between the extension portions 144 and 146 of the second pad 140. The second extension portion 146 is a portion extending in a direction opposite to the edge 110S of the semiconductor substrate 110 from the opening 135 between the extension portions 144 and 146 of the second pad 140.

Figure 11:
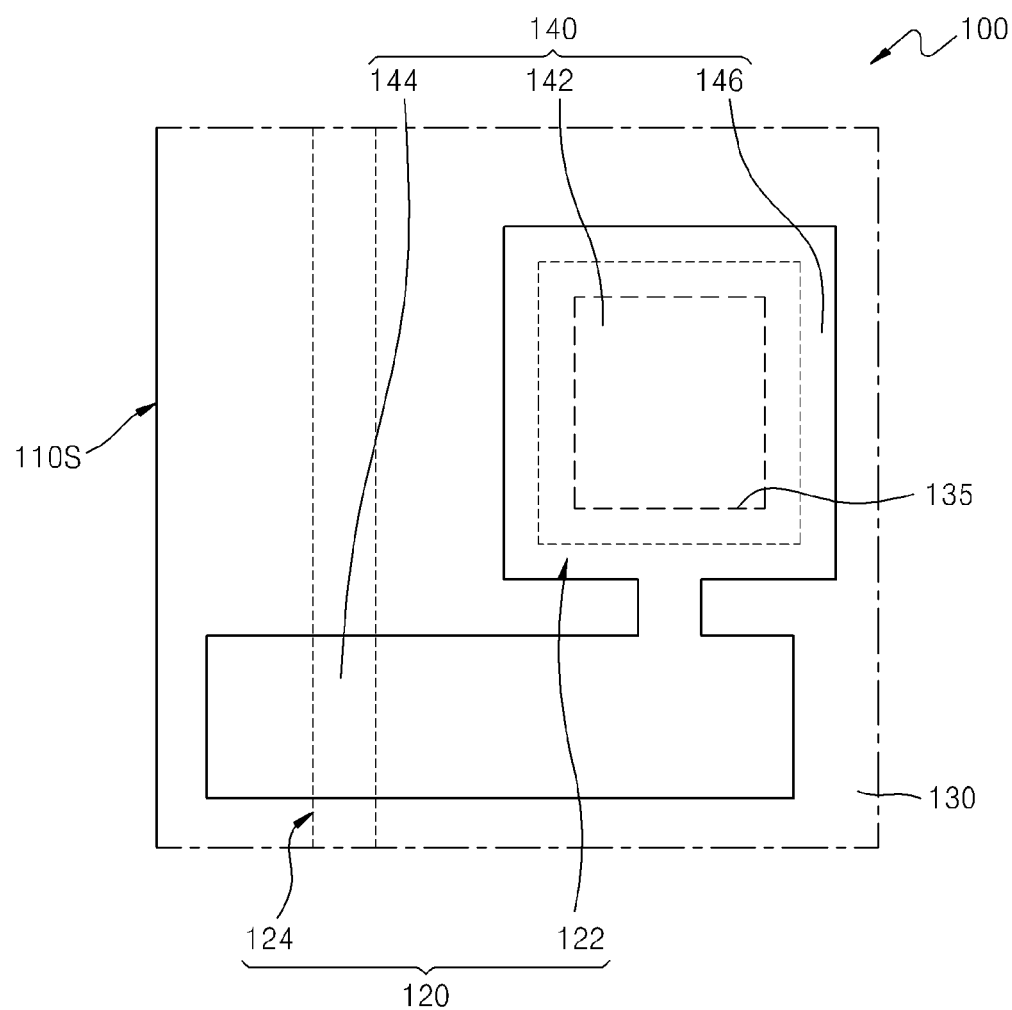

Referring to FIG. 11, the second pad 140 may extend over the conductive pattern 124 from the first pad 122. The second pad 140 may include the base portion 142 contacting the first pad 122 and extension portions 144 and 146 formed on the first insulation layer 130. The extension portions 144 and 146 of the second pad 140 may include the first extension portion 144 and the second extension portion 146. The first extension portion 144 may extend to be more closely adjacent to the edge 110S of the semiconductor substrate 110 than the conductive pattern 124.

The first extension portion 144 is a portion extending towards the edge 110S of the semiconductor substrate 110 from the base portion 142 between the extension portions 144 and 146 of the second pad 140. The second extension portion 146 is a portion extending in a direction opposite to the edge 110S of the semiconductor substrate 110 from the opening 135 between the extension portions 144 and 146 of the second pad 140. The first extension portion 144 may not extend from the base portion 142 to the edge 110S of the semiconductor substrate 110 in a shortest distance direction and may extend from the shortest distance direction by a gap. That is, if the second pad 140 of FIG. 11 and the second pad 140 of FIG. 9 are formed in the first semiconductor chip 100, gaps between the first extension portions 144 may be greater or smaller than those between the first pads 122. Thus, gaps between pads used to connect bonding wires may be adjusted. Shapes of the first semiconductor chip 100 of FIG. 9 and the first semiconductor chip 100 of FIG. 11 are different; however, a redundant description between the figures is omitted here.

Figure 12:
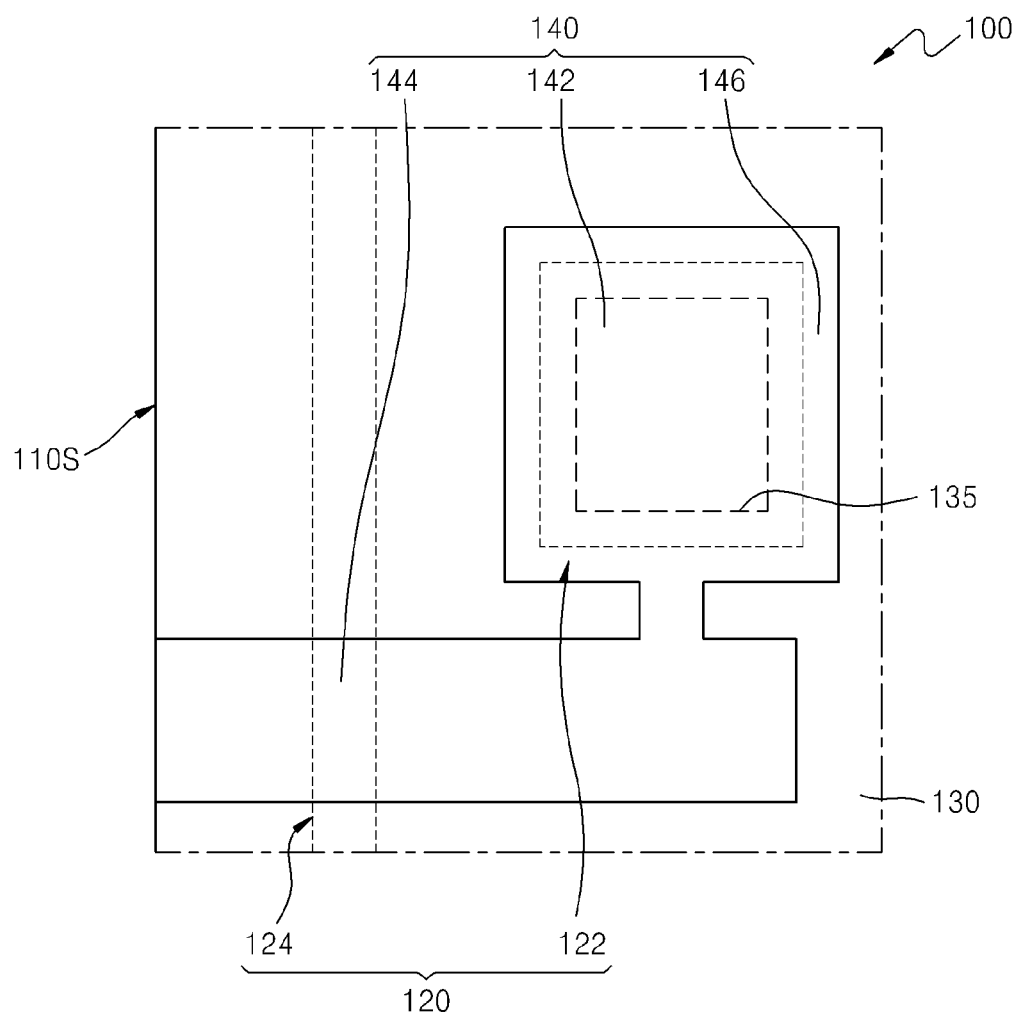

Referring to FIG. 12, the second pad 140 may extend to the edge 110S of the semiconductor substrate 110. The second pad 140 of the first semiconductor chip 100 of FIG. 11 extends to be adjacent to and spaced apart from the edge 110S of the semiconductor substrate 110, whereas the second pad 140 of the first semiconductor chip 100 of FIG. 12 extends to the edge 110S of the semiconductor substrate 110. A redundant description of the second pad 140 of FIGS. 11 and 12 is omitted here.

The second pad 140 may include the base portion 142 contacting the first pad 122 and the extension portions 144 and 146 formed on the first insulation layer 130. The extension portions 144 and 146 of the second pad 140 may include the first extension portion 144 and the second extension portion 146. The first extension portion 144 may extend to the edge 110S of the semiconductor substrate 110.

The first extension portion 144 is a portion extending to the edge 110S of the semiconductor substrate 110 from the base portion 142 between the extension portions 144 and 146 of the second pad 140. The second extension portion 146 is a portion extending in a direction opposite to the edge 110S of the semiconductor substrate 110 from the opening 135 between the extension portions 144 and 146 of the second pad 140.

Shapes of the conductive pattern 124 of FIG. 11 and the conductive pattern 124 of FIG. 12 are similar. However, the shapes of the conductive patterns 124 of the semiconductor device 100 of FIGS. 11 and 12 can be similar to those of the conductive patterns 124 of FIGS. 5 through 8.

Figure 13:
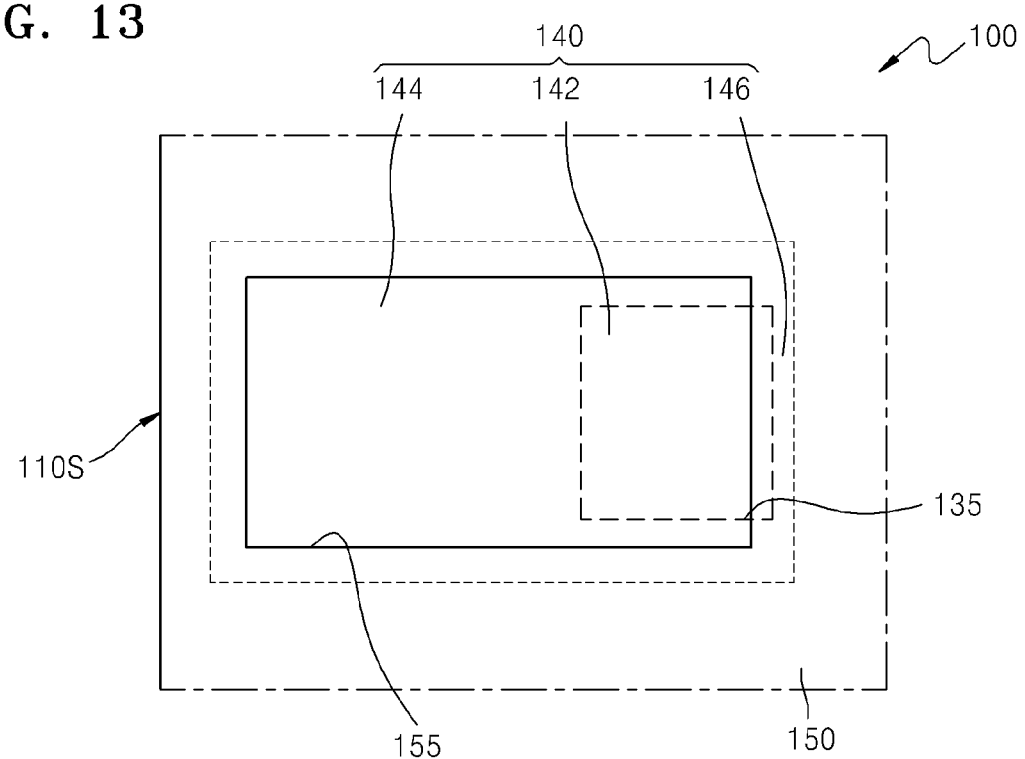
FIGS. 13 through 15 are plan layout views of a second pad and a second insulation layer of a semiconductor chip included in a semiconductor package according to some embodiments.
Figure 14:
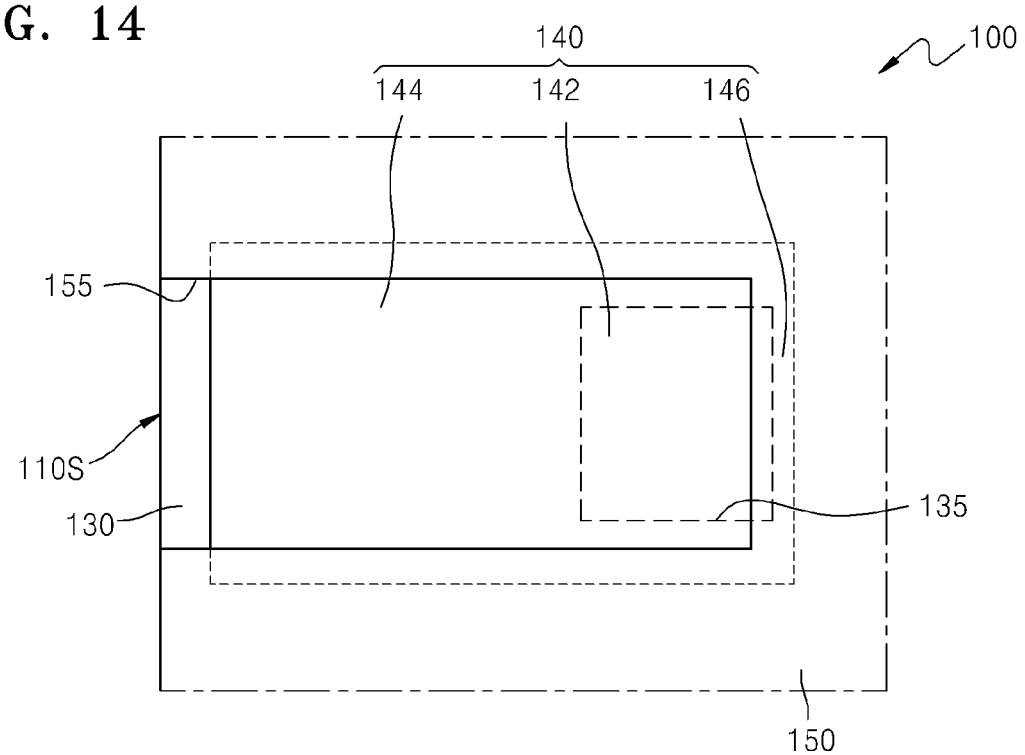
Figure 15:
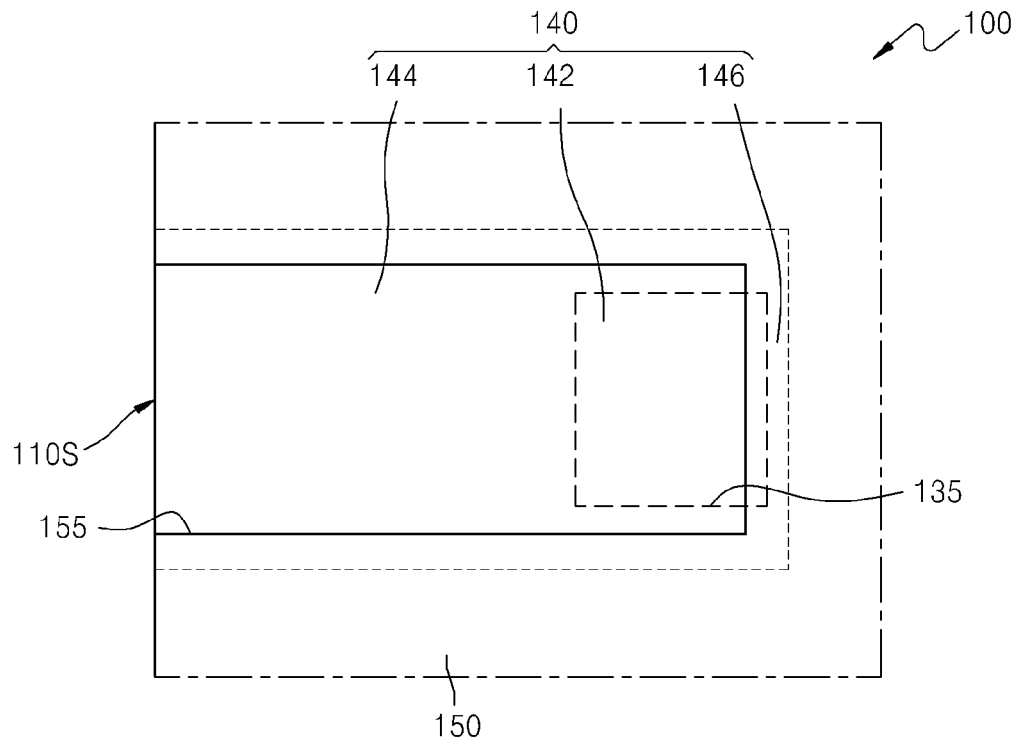

FIGS. 13 through 15 are plan layout views of the second pad 140 and the second insulation layer 150 of the first semiconductor chip 100 included in a semiconductor package according to some embodiments. Referring to FIG. 13, the first semiconductor chip 100 includes the second pad 140 and the second insulation layer 150. The first semiconductor chip 100 may be formed to expose a part of the second pad 140 and cover other parts thereof. The second insulation layer 150 may expose a part of the base portion 142 of the second pad 140 and parts of the extension portions 146 and 146. The second insulation layer 150 may have the open space 155 through which a part of the second pad 140 may be exposed. The first extension portion 144 of the second pad 140 may be exposed through the open space 155. A part of the base portion 142 of the second pad 140 may be exposed through the open space 155, and other part thereof may be covered by the second insulation layer 150. The open space 155 may have an opening shape. That is, the open space 155 may be a space spaced apart from the edge 110S of the semiconductor substrate 110. Thus, the second insulation layer 150 may cover side surfaces of the second pad 140.

Referring to FIG. 14, the first semiconductor chip 100 includes the second pad 140 and the second insulation layer 150. The first semiconductor chip 100 may be formed to expose a part of the second pad 140 and cover other parts thereof. The second insulation layer 150 may expose a part of the base portion 142 of the second pad 140 and parts of the extension portions 146 and 146. The second insulation layer 150 may have the open space 155 through which a part of the second pad 140 may be exposed. The first extension portion 144 of the second pad 140 may be exposed through the open space 155. A part of the base portion 142 of the second pad 140 may be exposed through the open space 155, and another part thereof may be covered by the second insulation layer 150. The second extension portion 146 of the second pad 140 may be covered by the second insulation layer 150. Alternatively, the second insulation layer 150 may be formed to expose the base portion 142 of the second pad 140 and the first extension portion 144, expose a part of the second extension portion 146, and cover another part of the second extension portion 146. The open space 155 may have a notch shape. That is, the open space 155 may be a space extending from the edge 110S of the semiconductor substrate 110. Thus, the second insulation layer 150 may expose parts of side surfaces of the second pad 140. That is, the second insulation layer 150 may expose the side surfaces of the second pad 140 facing the edge 110S of the semiconductor substrate 110.

The second pad 140 is adjacent to and spaced apart from the edge 110S of the semiconductor substrate 110, and thus a part of the first insulation layer 130 adjacent to the edge 110S of the semiconductor substrate 110 may be exposed through the open space 155.

Referring to FIG. 15, the first semiconductor chip 100 includes the second pad 140 and the second insulation layer 150. The second insulation layer 150 may have the open space 155 through which a part of the second pad 140 may be exposed. The open space 155 may have a notch shape. That is, the open space 155 may be a space extending from the edge 110S of the semiconductor substrate 110. Thus, the second insulation layer 150 may expose parts of side surfaces of the second pad 140. The second pad 140 may extend to the edge 110S of the semiconductor substrate 110. The second insulation layer 150 may expose the side surfaces of the second pad 140 contacting the edge 110S of the semiconductor substrate 110.

Shape of the second pad 140 of FIGS. 13 and 14 are similar to those of the second pads 140 of FIGS. 5, 7, and 9. A shape of the second pad 140 of FIG. 15 is similar to those of the second pads 140 of FIGS. 6, 8, and 10. However, the shapes of the second pad 140 of the semiconductor device 100 of FIGS. 13-15 can also be similar to those of the second pad 140 of FIGS. 11 and 12.

Figure 16:
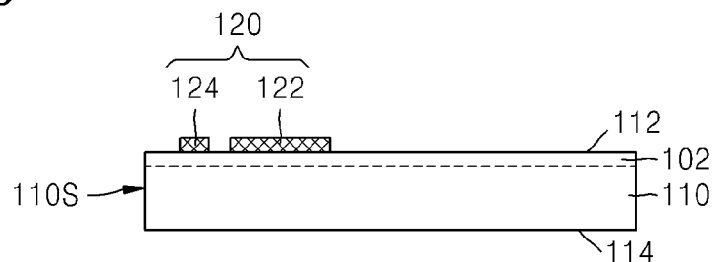
FIGS. 16 thorough 24 are cross-sectional views illustrating a method of manufacturing a semiconductor package according to some embodiments.

FIGS. 16 thorough 24 are cross-sectional views illustrating a method of manufacturing the semiconductor package 1 according to some embodiments. In more detail, FIGS. 16 thorough 24 are cross-sectional views illustrating a method of manufacturing the first semiconductor chip 100 and the semiconductor package 1 of FIGS. 1A and 1B according to some embodiments. Redundant descriptions between the first semiconductor chip 100 and the semiconductor package 1 of FIGS. 1A and 1B and the first semiconductor chip 100 and the semiconductor packages 2, 3, and 4 of FIGS. 2A through 15 are omitted, and differences will be described. A method of manufacturing the second through fourth semiconductor chips 200, 300, and 400 of FIGS. 1A, 2A, 3A, and 4A may be similar to that of manufacturing the first semiconductor chip 100 that will be described with reference to FIGS. 16 through 19.

Referring to FIG. 16, the first pad 122 and the conductive pattern 124 are formed on the semiconductor substrate 110 in which the semiconductor device 102 is formed in the active surface 112. The first pad 122 may be electrically connected to the semiconductor device 102. The first pad 122 and the conductive pattern 124 may be formed by forming and patterning a metal layer on the semiconductor substrate 110. The first pad 122 and the conductive pattern 124 may have the same level as that of the semiconductor substrate 110. A shape of the conductive pattern 124 may be different as shown in FIGS. 1A through 14 according to whether the first pad 122 and the conductive pattern 124 are patterned physically separately or integrally.

Figure 17:
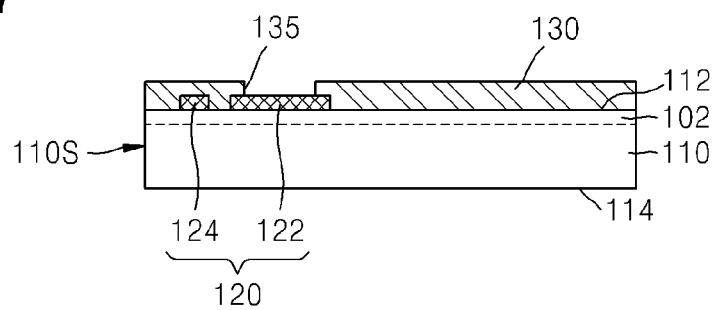

Referring to FIG. 17, the first insulation layer 130 that covers the conductive pattern 124 and has the opening 135 exposing a part of the first pad 122 may be formed on the semiconductor substrate 110. The first insulation layer 130 that has the opening 135 exposing the part of the first pad 122 and covers the conductive pattern 124 may be formed on the semiconductor substrate 110 by forming and patterning a first insulation material layer that covers the first pad 122 and the conductive pattern 124.

Figure 18:
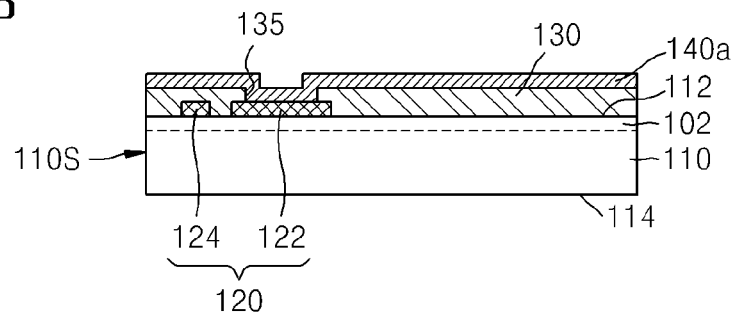

Referring to FIG. 18, a second pad material layer 140a covering the first insulation layer 130 is formed on the semiconductor substrate 110. The second pad material layer 140a may cover the part of the first pad 122 exposed through the opening 135.

Figure 19:
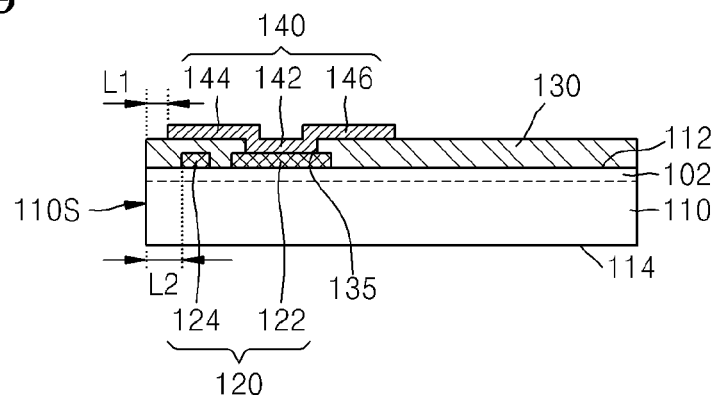

Referring to FIG. 19, the second pad 140 is formed by patterning the second pad material layer 140a of FIG. 18. The second pad 140 may include the base portion 142 contacting the first pad 122 and the first extension portion 144 and the second extension portion 146 that are formed on the first insulation layer 130.

A shape of the second pad 140 may be determined during a process of patterning the second pad material layer 140a of FIG. 18, and may be different as shown in FIGS. 1A through 14 according to whether the second pad 140 is formed to extend to the edge 110S of the semiconductor substrate 110 or to be adjacent to and spaced apart from the edge 110S of the semiconductor substrate 110.

A first gap L1 between the second pad 140 and the edge 110S of the semiconductor substrate 110 may have a smaller value than that of a second gap L2 between the conductive pattern 124 and the edge 110S of the semiconductor substrate 110. When the second pad 140 extends to the edge 110S of the semiconductor substrate 110, the first gap L1 may be 0.

Figure 20:
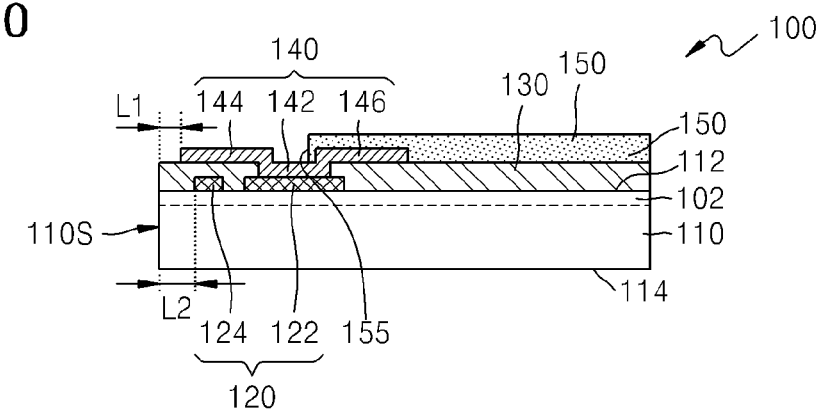

Referring to FIG. 20, the first semiconductor chip 100 is formed by forming the second insulation layer 150 that exposes a part of the second pad 140 and covers other parts thereof on the semiconductor substrate 110. The second insulation layer 150 having the open space 155 may be formed by forming and patterning a second insulation material layer that covers the second pad 140 on the semiconductor substrate 110. A shape of the open space 155 may be determined during a process of patterning the second insulation material layer, and thus shapes of the second insulation layer 150 and the open space 155 may be different as shown in FIGS. 1A through 14.

Figure 21:
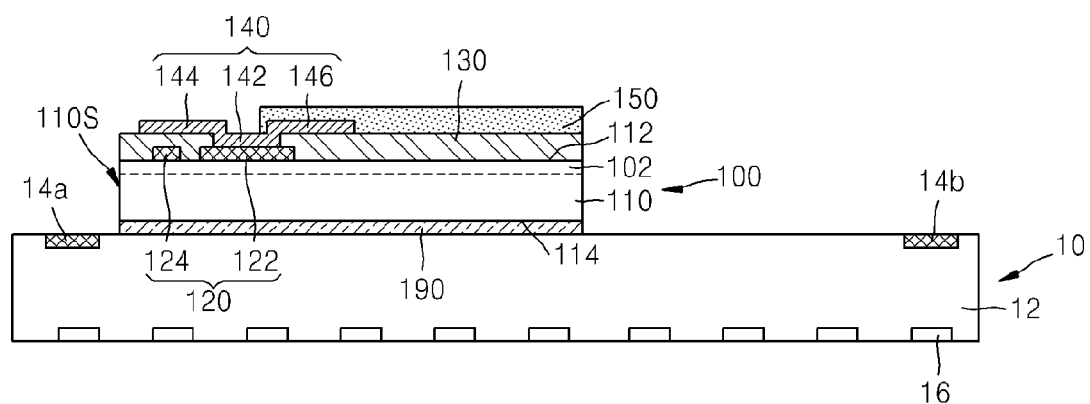

Referring to FIG. 21, the first semiconductor chip 100 is attached onto the package base substrate 10. The first semiconductor chip 100 may be stacked on the base substrate 10 after attaching the die adhesive film 190 on the non-active surface 114. The first semiconductor chip 100 may be attached onto the package base substrate 10 such that the top surface pads 14a and 14b of the base substrate 10 may be exposed.

Figure 22:
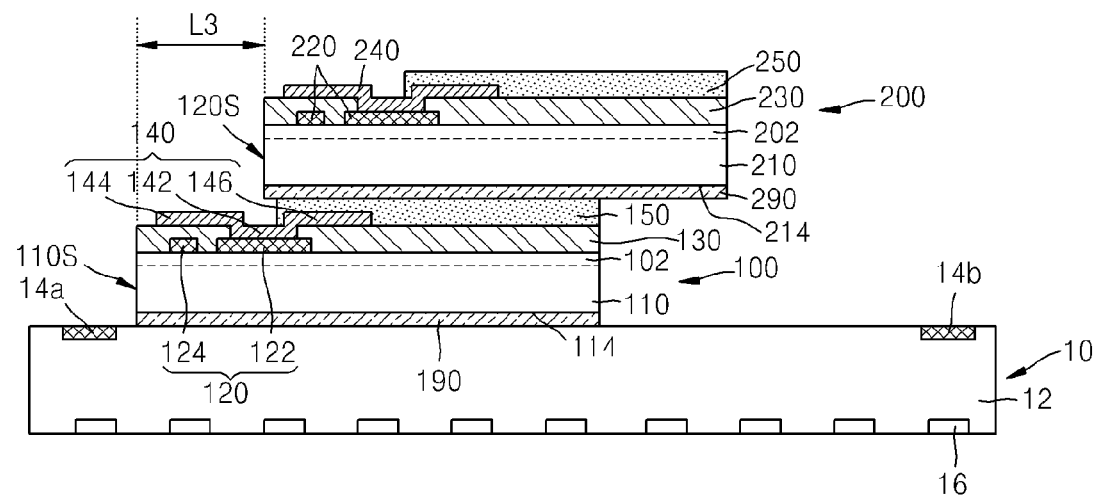

Referring to FIG. 22, the second semiconductor chip 200 is stacked on the first semiconductor chip 100. The second semiconductor chip 200 may be shifted by a predetermined distance in a first direction that is parallel to a main surface of the package base substrate 10 and may be stacked on the package base substrate 10 in such a way that a part of a top surface of the first semiconductor chip is exposed. The distance by which the second semiconductor chip 200 is shifted may be a third gap L3 between the edge 110S of the semiconductor substrate 110 of the first semiconductor chip 100 and the edge 110S of the semiconductor substrate 110 of the second semiconductor chip 200. The third gap L3 may be greater than a shortest distance from the edge 110S of the semiconductor substrate 110 to the base portion 142 of the second pad 140 and may be smaller than a shortest distance from the edge 110S of the semiconductor substrate 110 to the second extension portion 146 of the second pad 140.

Figure 23:
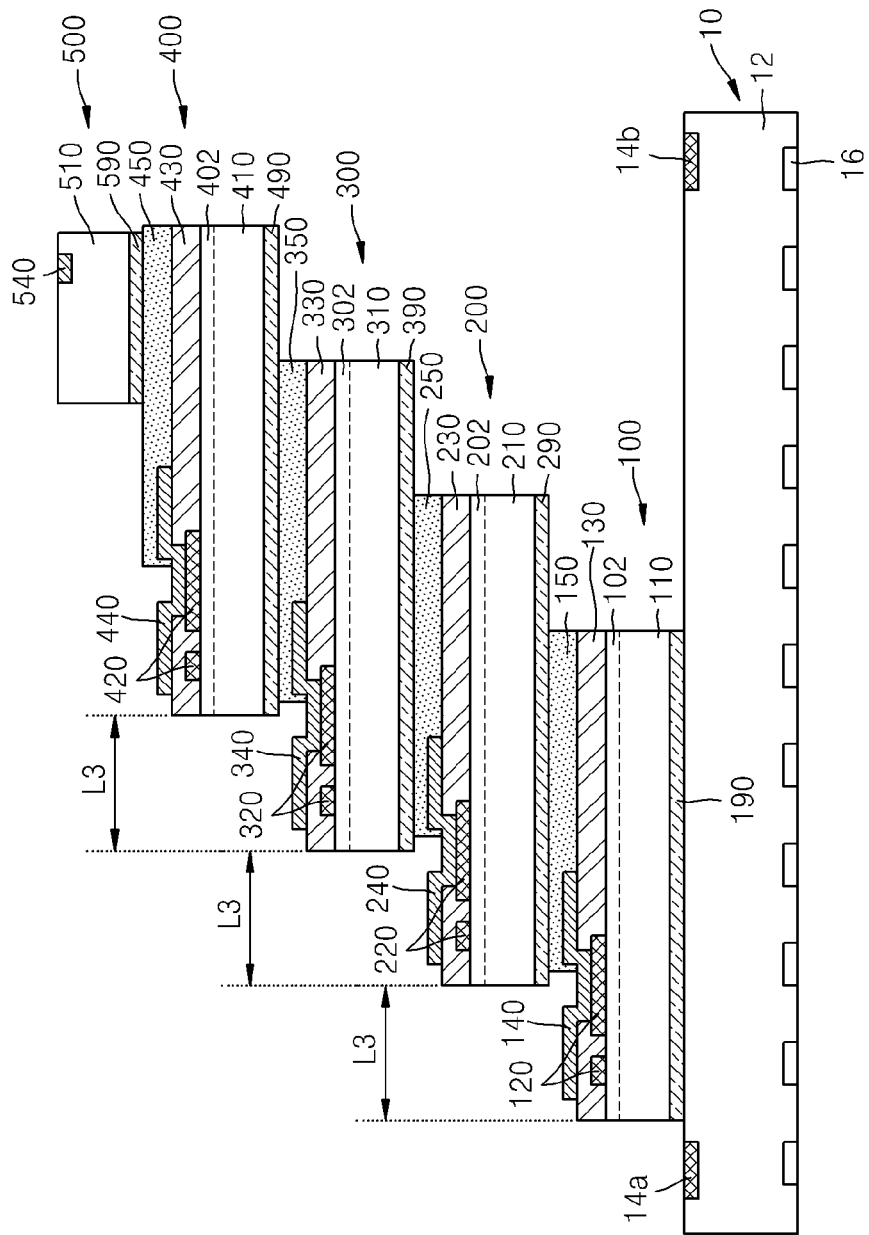

Referring to FIG. 23, the third semiconductor chip 300 and the fourth semiconductor chip 400 are sequentially stacked on the second semiconductor chip 200. The third semiconductor chip 300 may be shifted by the third gap L3 in the first direction and may be stacked on the second semiconductor chip 200 such that a part of a top surface of the second semiconductor chip 200 is exposed. The fourth semiconductor chip 400 may be shifted by the third gap L3 in the first direction and may be stacked on the third semiconductor chip 300 such that a part of a top surface of the third semiconductor chip 300 is exposed. That is, the semiconductor chips 100, 200, 300, and 400 may be shifted by the third gap L3 in the first direction that is parallel to the main surface of the package base substrate 10 and may be sequentially stacked on the package base substrate 10 in such a way that a part of a top surface of a lower semiconductor chip is exposed. Although the semiconductor chips 200, 300, and 400 have been described as being shifted by the same third gap L3, the semiconductor chips 200, 300, and 400 may be shifted from the corresponding semiconductor chip 100, 200, and 300, respectively, by different amounts.

Thereafter, the auxiliary semiconductor chip 500 is attached on an uppermost semiconductor chip among the semiconductor chips 100, 200, 300, and 400, i.e., the fourth semiconductor chip 400 in this example; however in other examples, a different semiconductor chip may be the uppermost semiconductor chip. The auxiliary semiconductor chip 500 may be attached on the package base substrate 10 along with the first semiconductor chip 100, between the first and second semiconductor chips 100 and 200, between the second and third semiconductor chips 200 and 300, or between the third and fourth semiconductor chips 300 and 400 as necessary.

Figure 24:
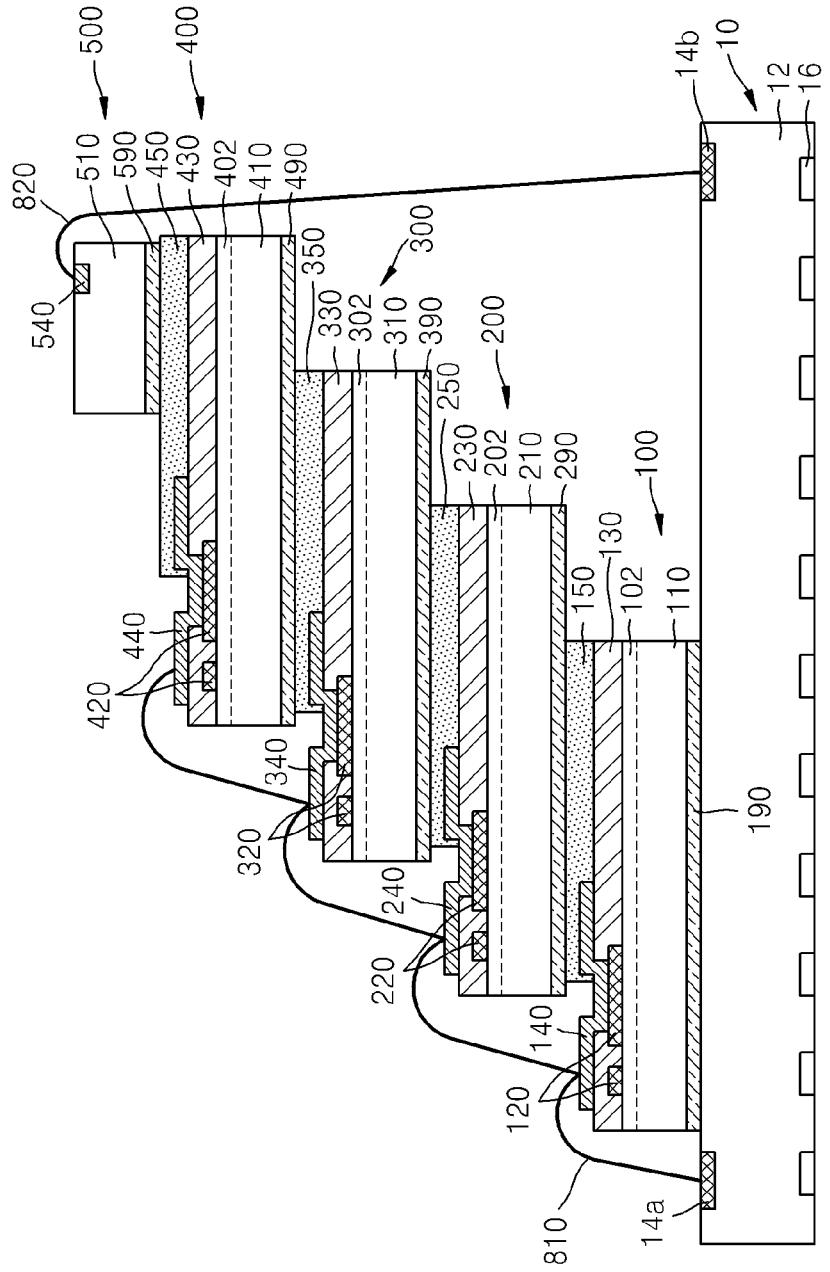

Referring to FIG. 24, the first bonding wire 810 that electrically connects each of the semiconductor chips 100, 200, 300, and 400 and the package base substrate 10, and the second bonding wire 820 that electrically connects the auxiliary semiconductor chip 500 and the package base substrate 10 are formed. The first bonding wire 810 may connect the second pads 140, 240, 340, and 440 of the semiconductor chips 100, 200, 300, and 400 and the first top surface pad 14a of the package base substrate 10. The first bonding wire 810 may sequentially connect the second pad 440 of the fourth semiconductor chip 400, the second pad 340 of the third semiconductor chip 300, the second pad 240 of the second semiconductor chip 200, and the second pad 140 of the first semiconductor chip 100 and then connect the second pads 140, 240, 340, and 440 and the first top surface pad 14a of the package base substrate 10. Alternatively, the first bonding wire 810 may separately connect between the second pads 140, 240, 340, and 440 of the semiconductor chips 100, 200, 300, and 400 and the first top surface pad 14a of the package base substrate 10.

The second bonding wire 820 may connect the connection pad 540 of the auxiliary semiconductor chip 500 and the second top surface pad 14b of the package base substrate 10.

Thereafter, as shown in FIGS. 1A, 2A, 3A, and 4A, the semiconductor packages 1, 2, 3, and 4 may be formed on the package base substrate 10 by forming a molding member 900 that surrounds the semiconductor chips 100, 200, 300, and 400, the auxiliary semiconductor chip 500, and the first and second bonding wires 810 and 820, and forming the contact terminal 18 on the bottom surface pad 16 of the package base substrate 10.

Figure 25A:
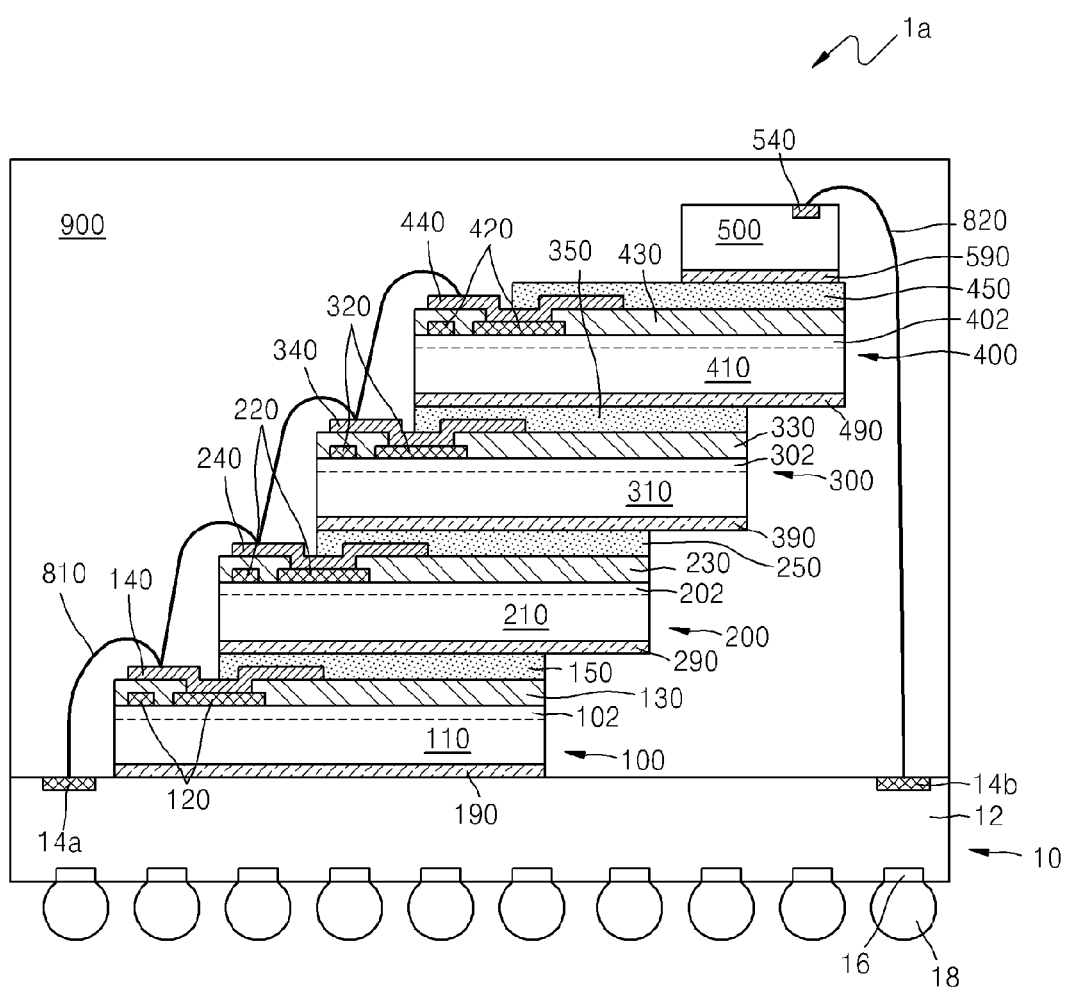
FIGS. 25A through 28B are cross-sectional views illustrating examples of semiconductor packages according to some embodiments.

FIG. 25A is a cross-sectional view illustrating an example of a semiconductor package 1A according to an embodiment. In more detail, the semiconductor package 1A of FIG. 25A is different from the semiconductor package 1 of FIGS. 1A and 1B in terms of a layout of the second insulation layers 150, 250, 350, and 450 and the semiconductor chips 200, 300, and 400 stacked on the second insulation layers 150, 250, and 350, respectively, and thus redundant descriptions are omitted here.

Referring to FIG. 25A, the semiconductor package 1A has the semiconductor chips 100, 200, 300, and 400 that are stacked on the package base substrate 10. The semiconductor chips 100, 200, 300, and 400 may be shifted by a predetermined distance in a first direction that is parallel to a main surface of the package base substrate 10 and may be sequentially stacked on the package base substrate 10 in such a way that a part of a top surface of a lower semiconductor chip is exposed.

The second semiconductor chip 200 may be stacked on the first semiconductor chip 100 after attaching the die adhesive film 290 thereon. The second semiconductor chip 200 onto which the die adhesive film 290 is attached may be formed on the second insulation layer 150. A top surface of the second insulation layer 150 may be entirely covered and side surfaces thereof may be exposed by the second semiconductor chip 200 onto which the die adhesive film 290 is attached.

Side surfaces of the second insulation layer 150 and the second semiconductor chip 200 may be substantially coplanar along a direction perpendicular to the main surface of the package base substrate 10 on the second pad 140. Side surfaces of the third semiconductor chip 300 stacked on the second semiconductor chip 200, the fourth semiconductor chip 400 stacked on the third semiconductor chip 300, and the second insulation layers 250 and 350 may also be substantially coplanar along the direction perpendicular to the main surface of the package base substrate 10 on the second pads 240 and 340, respectively.

Figure 25B:
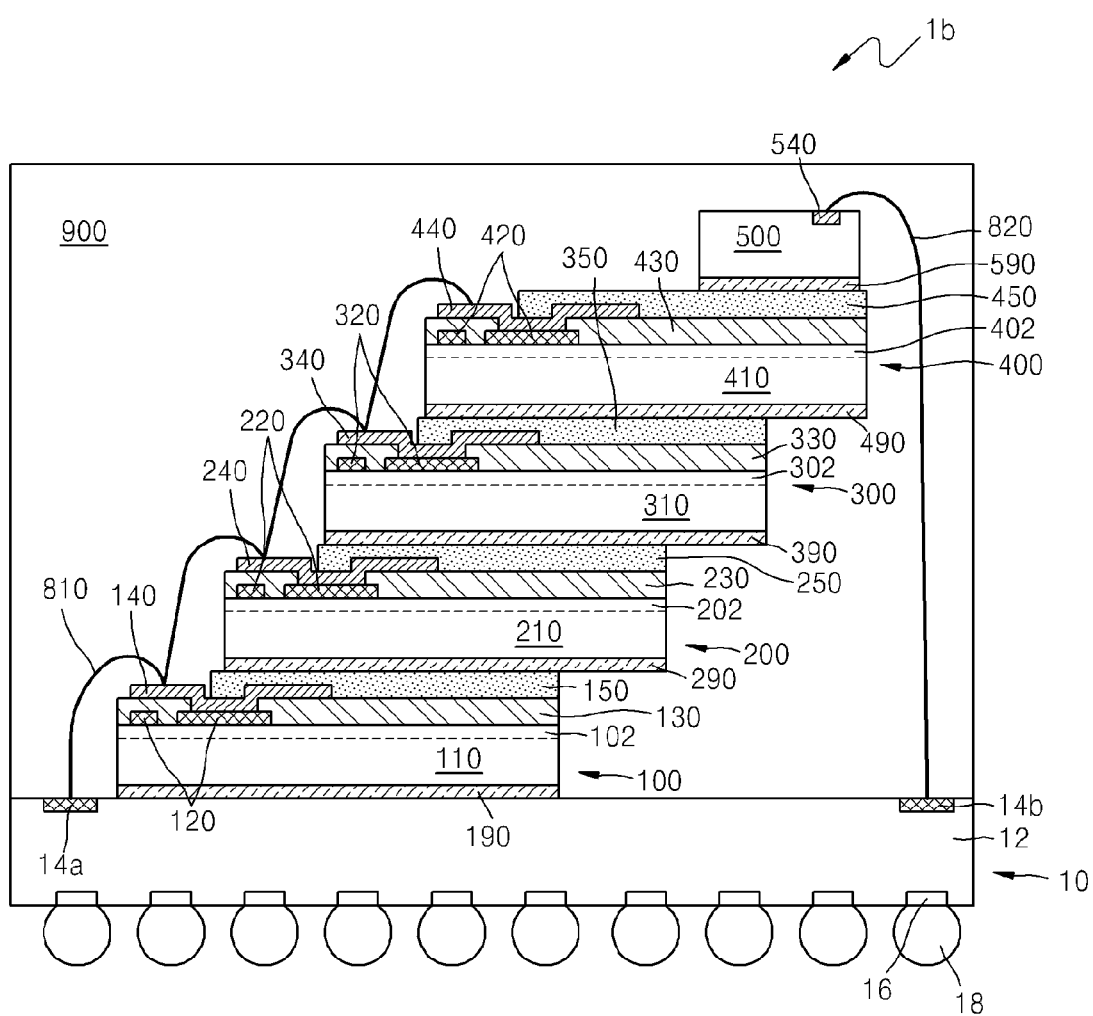
Figure 26A:
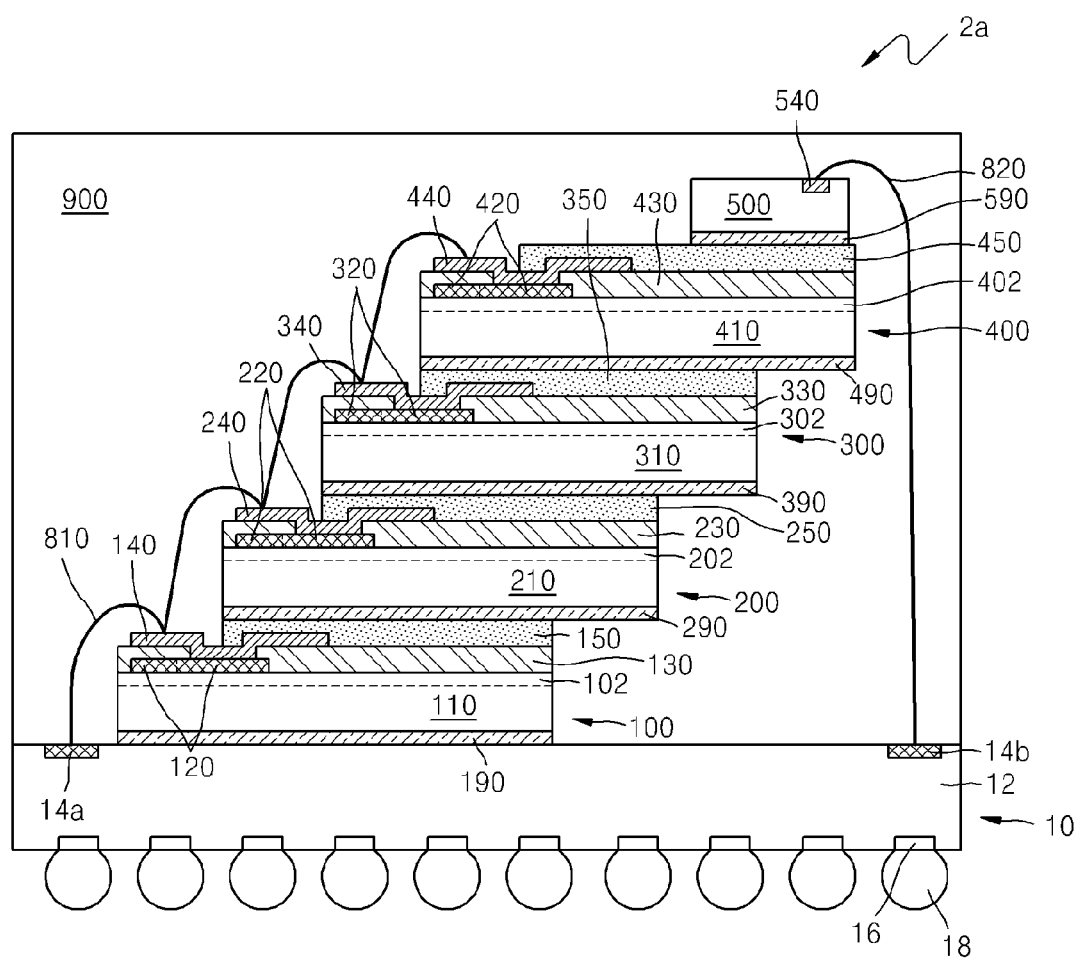
Figure 26B:
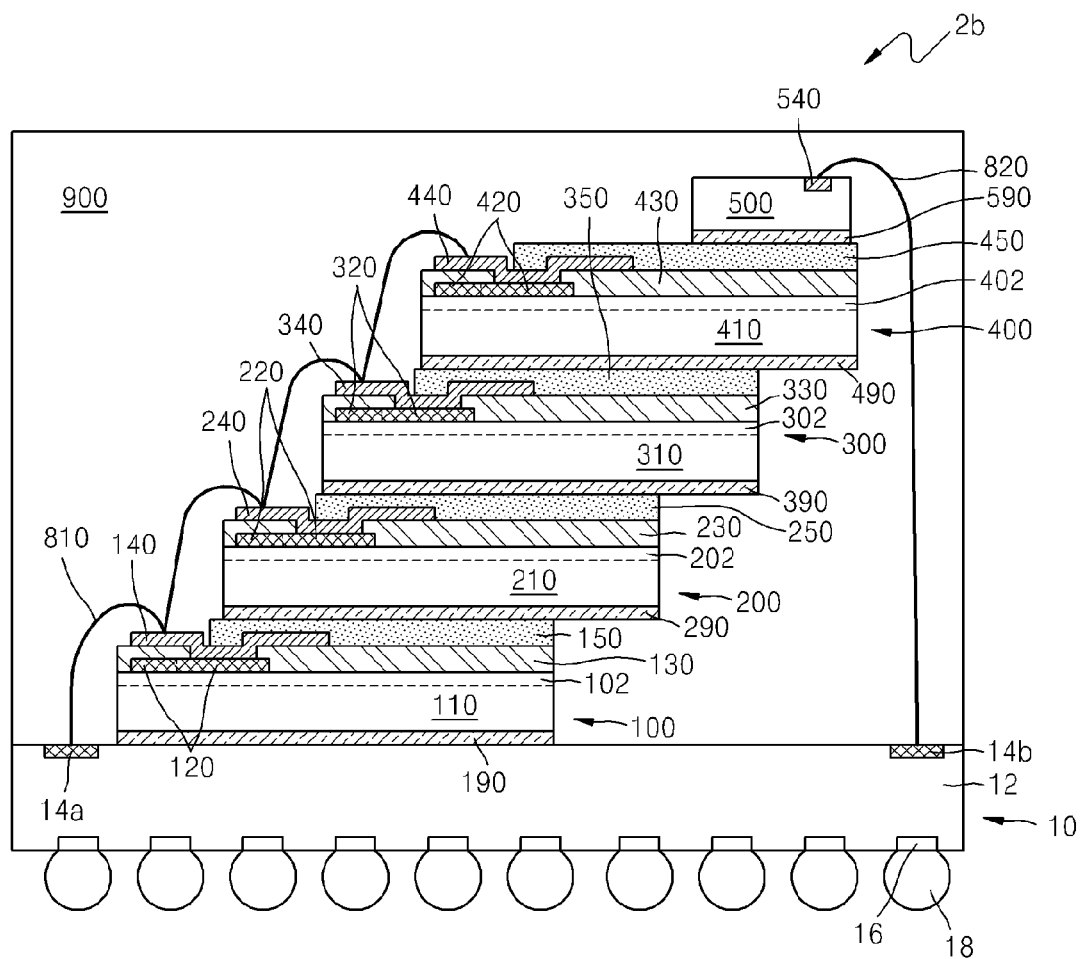
Figure 27A:
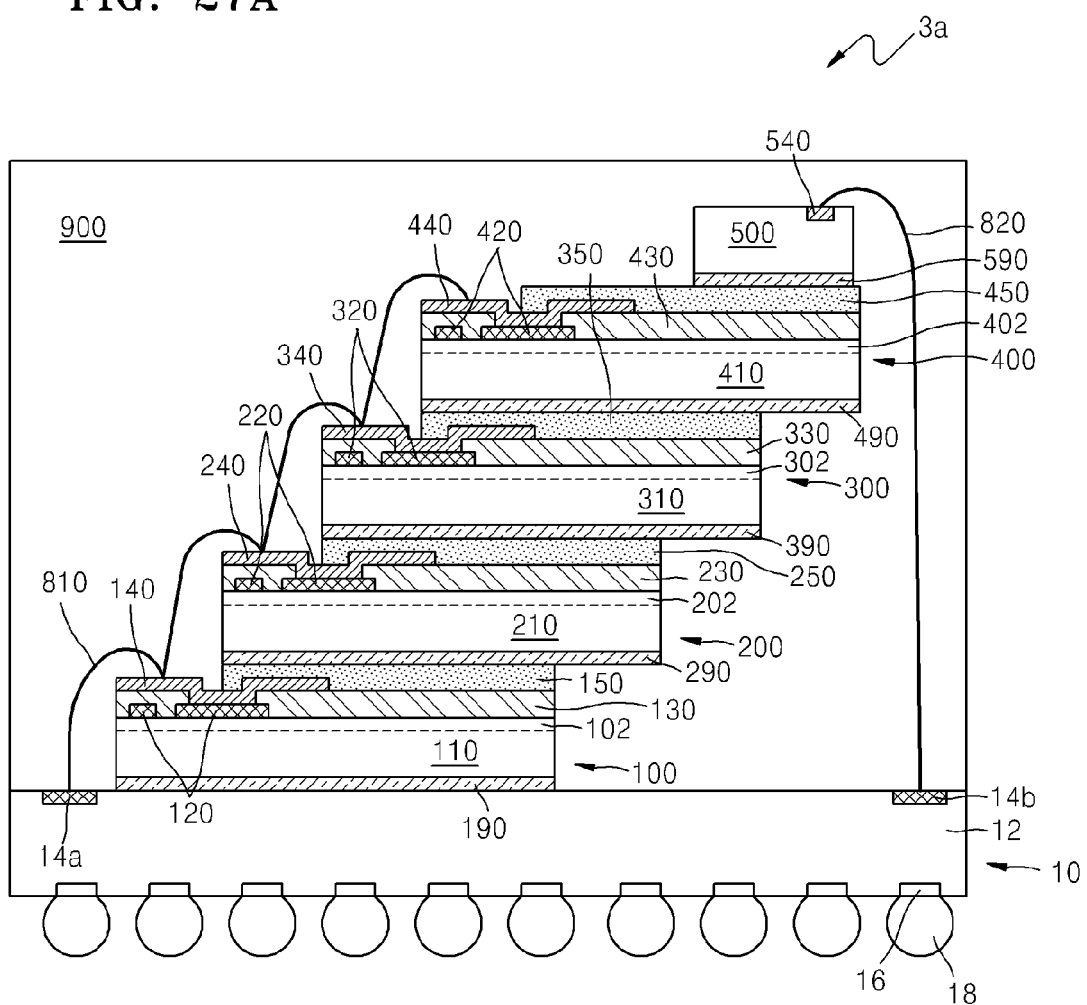
Figure 27B:
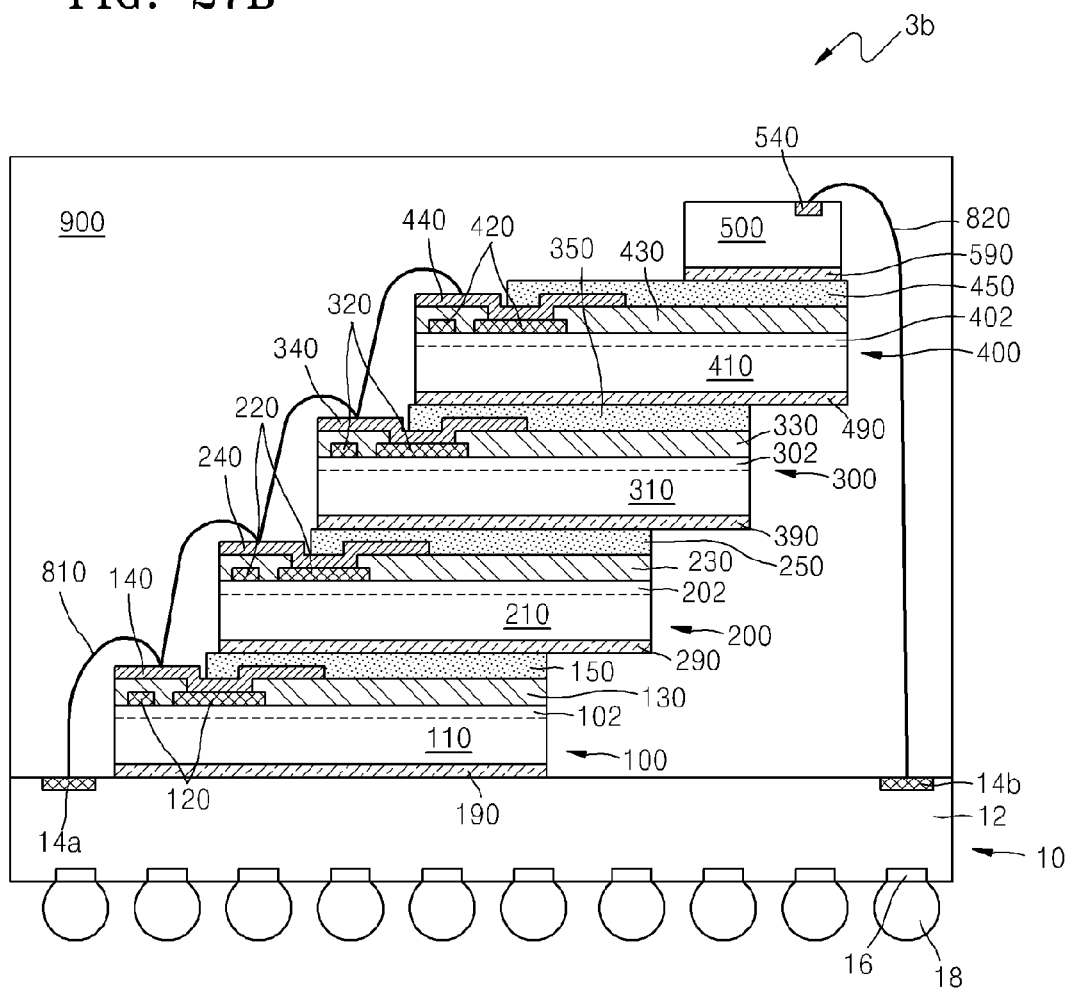
Figure 28A:
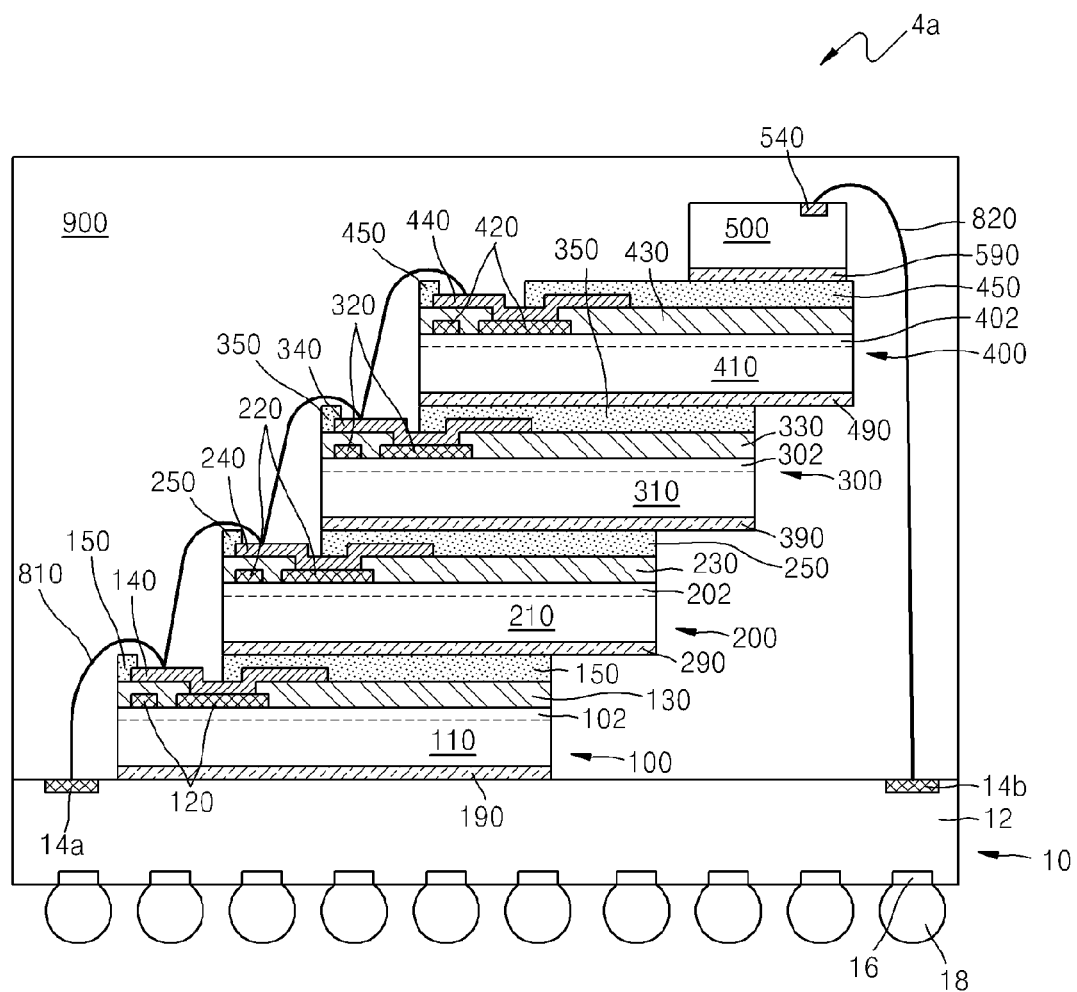
Figure 28B:
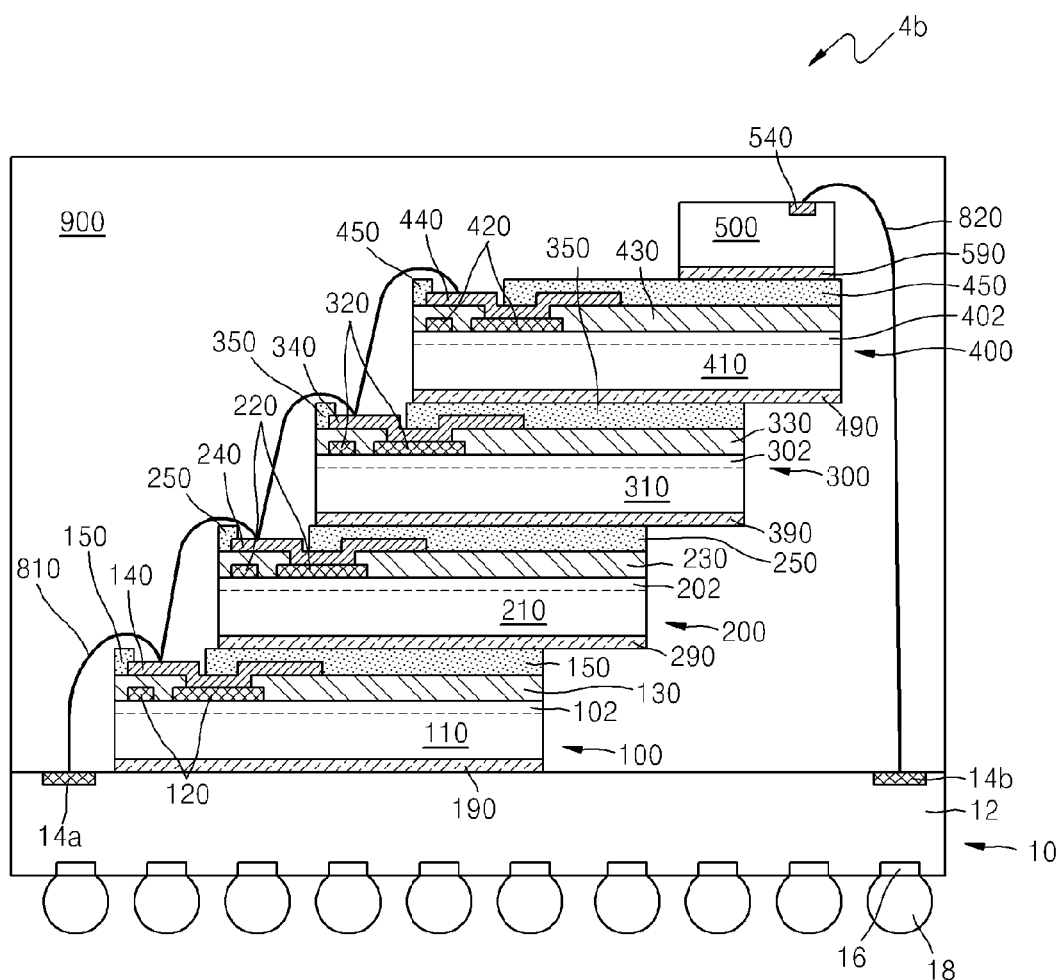

FIG. 25B is a cross-sectional view illustrating an example of a semiconductor package 1B according to an embodiment. In more detail, the semiconductor package 1B of FIG. 25B is different from the semiconductor package 1 of FIGS. 1A and 1B in terms of a layout of the second insulation layers 150, 250, and 350 and the semiconductor chips 200, 300, and 400 stacked on the second insulation layers 150, 250, and 350, respectively. Redundant descriptions are omitted.

Referring to FIG. 25B, the semiconductor package 1B has the semiconductor chips 100, 200, 300, and 400 that are stacked on the package base substrate 10. The semiconductor chips 100, 200, 300, and 400 may be shifted by a predetermined distance in a first direction that is parallel to a main surface of the package base substrate 10 and may be sequentially stacked on the package base substrate 10 in such a way that a part of a top surface of a lower semiconductor chip is exposed.

The second semiconductor chip 200 may be stacked on the first semiconductor chip 100 after attaching the die adhesive film 290 thereon. The second semiconductor chip 200 onto which the die adhesive film 290 is attached may be formed on the second insulation layer 150. A part of a top surface of the second insulation layer 150 may be exposed by the second semiconductor chip 200 onto which the die adhesive film 290 is attached.

That is, the part of a top surface of the second insulation layer 150 may be exposed by the second semiconductor chip 200 on the second pad 140. Parts of top surfaces of the second insulation layers 250 and 350 may be exposed by the third semiconductor chip 300 and the fourth semiconductor chip 400 on the second pads 240 and 340, respectively.

Referring to FIGS. 1A, 1B, 25A, and 25B, side surfaces of the second insulation layer 150 facing the edge 110S of the semiconductor substrate 110 of the first semiconductor chip 100 and side surfaces of the second semiconductor chip 200 may be substantially coplanar in the direction perpendicular to the main surface of the package base substrate 10 or, the side surfaces of the second insulation layer 150 or the side surfaces of the second semiconductor chip 200 may be offset.

Differences between FIG. 26A or 26B and FIGS. 2A and 2B are similar to those between FIG. 25A or 25B and FIGS. 1A and 1B, i.e. shapes of the second insulation layers 150, 250, and 350 and the second through fourth semiconductor chips 200, 300, and 400 stacked on the second insulation layers 150, 250, and 350, and thus redundant descriptions are omitted.

Differences between FIG. 27A or 27B and FIGS. 3A and 3B are similar to those between FIG. 25A or 25B and FIGS. 1A and 1B, i.e. shapes of the second insulation layers 150, 250, and 350 and the second through fourth semiconductor chips 200, 300, and 400 stacked on the second insulation layers 150, 250, and 350, and thus redundant descriptions are omitted.

Differences between FIG. 28A or 28B and FIGS. 4A and 4B are similar to those between FIG. 25A or 25B and FIGS. 1A and 1B, i.e. shapes of the second insulation layers 150, 250, and 350 and the second through fourth semiconductor chips 200, 300, and 400 stacked on the second insulation layers 150, 250, and 350, and thus redundant descriptions are omitted.

Figure 29A:
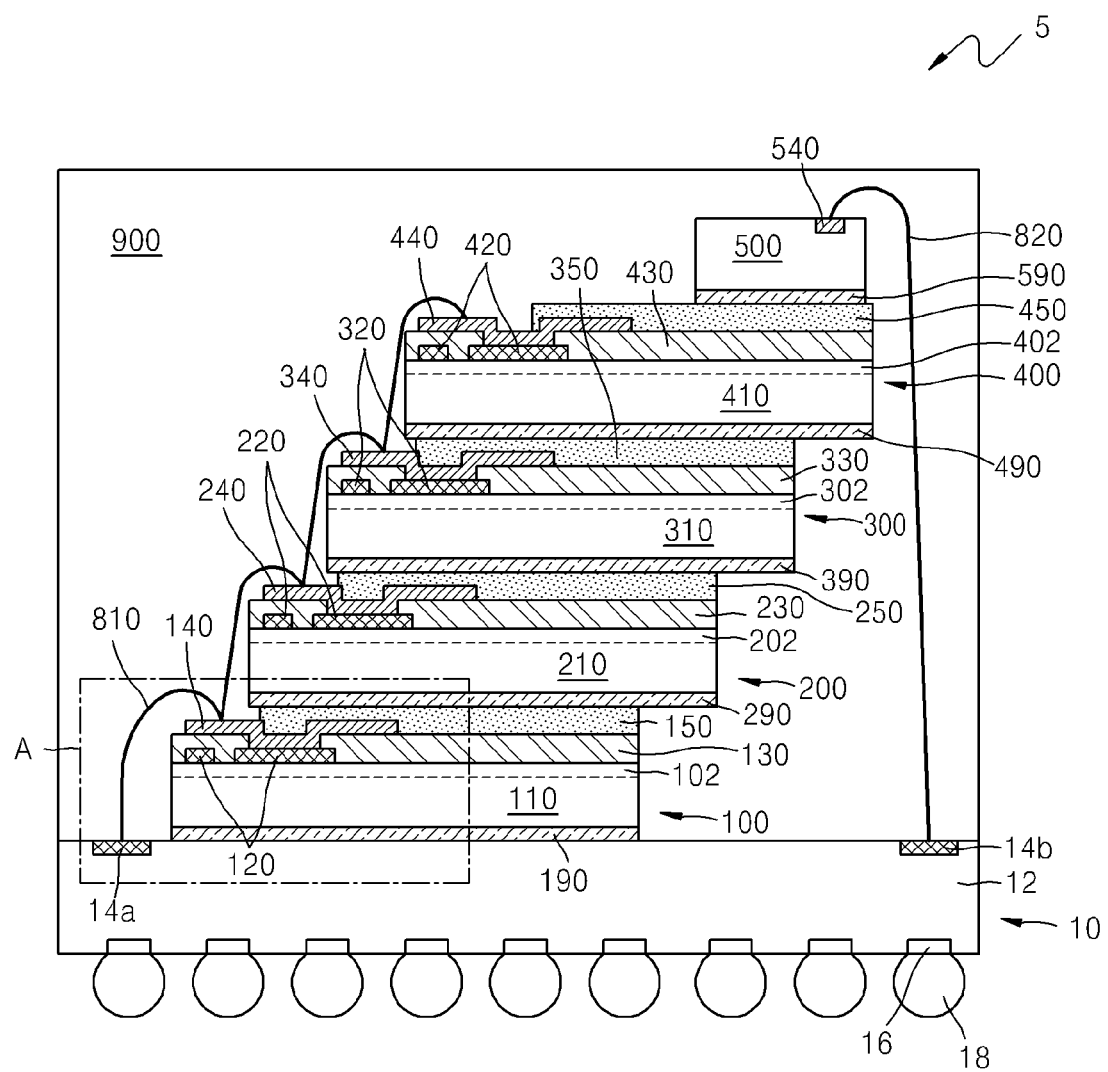
FIGS. 29A and 29B are a cross-sectional view illustrating an example of semiconductor package according to an embodiment.
Figure 29B:
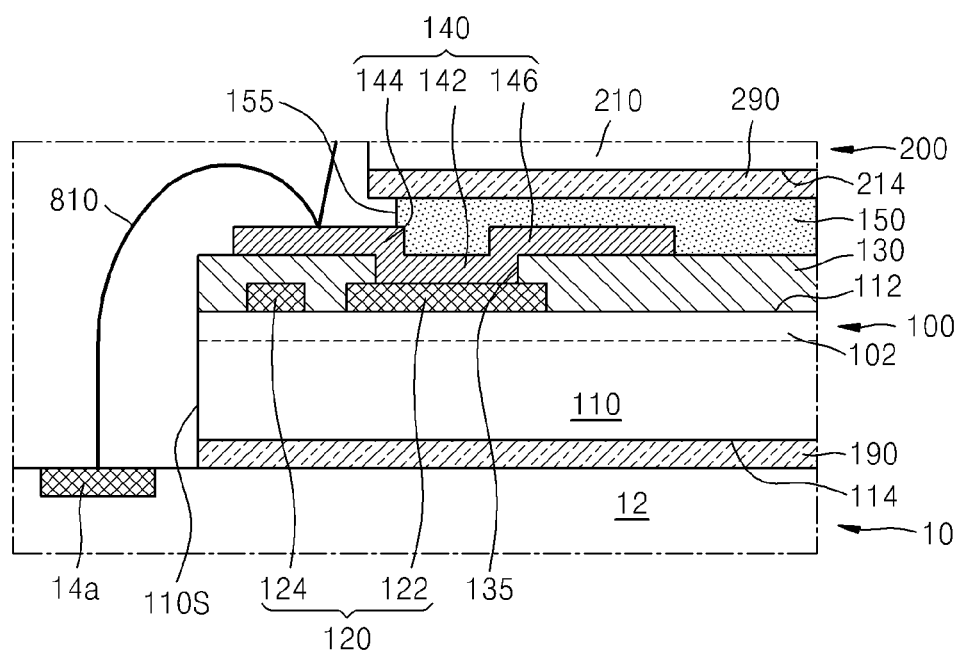

FIGS. 29A and 29B are a cross-sectional view illustrating an example of semiconductor package according to an embodiment. In this embodiment, the semiconductor package 5 may be similar to the semiconductor packages described herein and redundant descriptions are omitted; however, the second insulation layers 150, 250, 350 and 450 may extend over the base portion 142 of the second pad 140 of the corresponding semiconductor chip 100, 200, 300, and 400. As a result, an amount the semiconductor chips 200, 300, and 400 may be offset from an edge of the underlying corresponding semiconductor chip 100, 200, and 300 may be further reduced.

For example, the base portion 140 and the second extension portion 146 may both be covered by the second insulation layer 150. However, the first extension portion 144 may be at least partially exposed by the second insulation layer 150. The semiconductor chip 200 may then be stacked on the first semiconductor chip 100 closer to the edge 110S. Thus, a volume of the semiconductor package 5 may be reduced.

Figure 30:
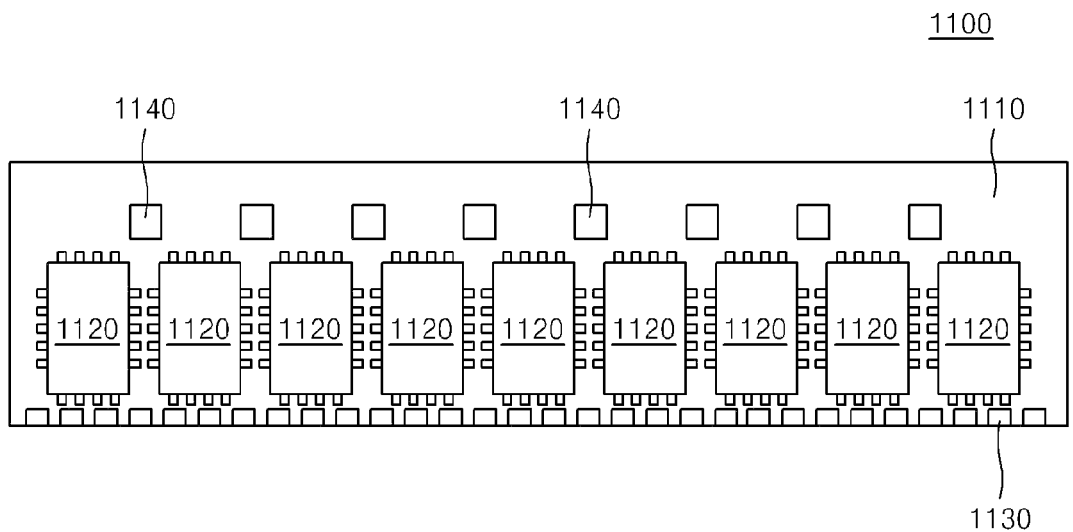
FIG. 30 is a plan view of a memory module including multiple semiconductor packages according to an embodiment.

FIG. 30 is a plan view of a memory module 1100 including multiple semiconductor packages 1120 according to an embodiment. Referring to FIG. 20, the memory module 1100 includes a module substrate 1110 and the semiconductor packages 1120 attached to the module substrate 1110. The semiconductor packages 1120 include semiconductor packages according to the some embodiments. For example, the semiconductor packages 1120 may include the semiconductor packages 1, 2, 3, 4, 1a, 1b, 2a, 2b, 3a, 3b, 4a, and 4b of FIGS. 1A, 2A, 3A, 4A, and 25A through 28B, or the like.

A connection portion 1103 that may be inserted into a socket of a mother board may be disposed in one or more sides of the module substrate 1110. A ceramic decoupling capacitor 1140 may be disposed on the module substrate 1110. The memory module 1100 of the inventive concept is not limited to FIG. 29 and may be manufactured in various forms.

Figure 31:
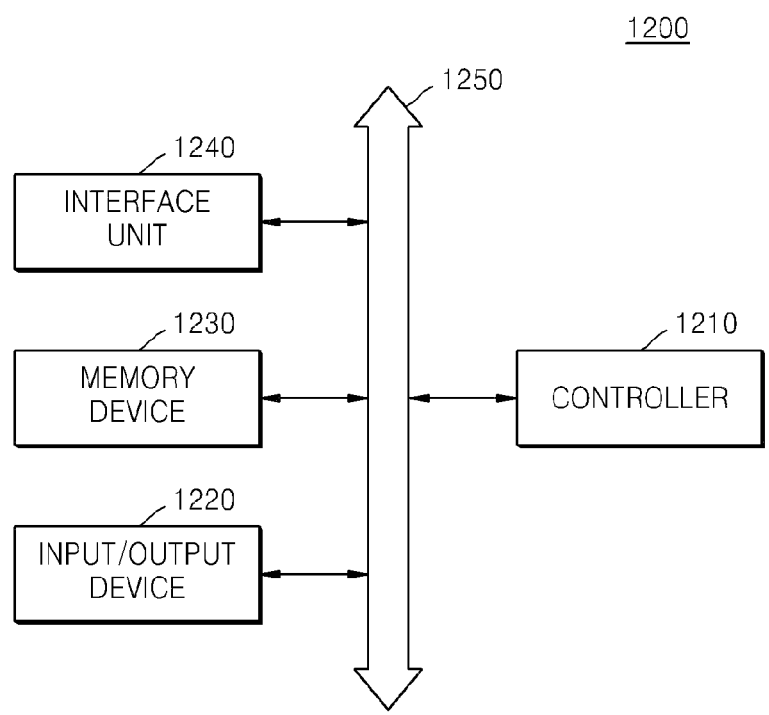
FIG. 31 is a block diagram of a system including semiconductor package according to an embodiment.

FIG. 31 is a block diagram of a system 1200 including semiconductor package according to an embodiment. Referring to FIG. 31, the system 1200 includes a controller 1210, an input/output device 1220, a memory device 1230, and an interface unit 1240. The system 1200 may be a mobile system or a system that transmits or receives information. In some embodiments, the mobile system is a personal digital assistant (PDA), a portable computer, a web tablet, a wireless phone, a mobile phone, a digital music player, or a memory card. The controller 1210 is configured to control an execution program of the system 1200 and may be a microprocessor, a digital signal processor, a microcontroller, or a similar device. The input/output device 1220 may be used to input or output data of the system 1200. The system 1200 may be connected to an external device, for example, a personal computer (PC) or a network, and may exchange data with the external device, by using the input/output device 1220. The input/output device 1220 may be, for example, a keypad, a keyboard, or a display device.

The memory device 1230 may store codes and/or data for operating the controller 1210, or store data processed by the controller 1210. The memory device 1230 includes the semiconductor package according to the inventive concept. For example, the memory device 1230 may include the semiconductor packages 1, 2, 3, 4, 1a, 1b, 2a, 2b, 3a, 3b, 4a, and 4b of FIGS. 1A, 2A, 3A, 4A, and 25A through 28B.

The interface unit 1240 may be a data transmission path between the system 1200 and an external device. The controller 1210, the input/output device 1220, the memory device 1230, and the interface unit 1240 may communicate with one another via a bus 1250. The system 1200 may be a mobile phone, an MP3 player, a navigation system, a portable multimedia player (PMP), a solid-state disk (SSD), or a household appliance.

Although the memory device 1230 has been used as an example of a device having a semiconductor package as described herein, the controller 1210, the input/output device 1220, and the interface unit 1240 may include semiconductor packages as described herein.

Figure 32:
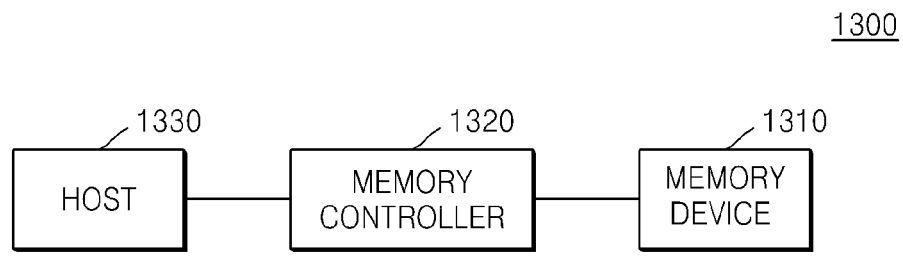
FIG. 32 is a block diagram of a memory card including semiconductor package according to an embodiment.

FIG. 32 is a block diagram of a memory card 1300 including semiconductor package according to an embodiment. Referring to FIG. 32, the memory card 1300 includes a memory device 1310 and a memory controller 1320. The memory device 1310 may store data. In some embodiments, the memory device 1310 may have nonvolatile characteristics that may retain stored data even when a power supply is cut off. The memory device 1310 includes the semiconductor package according to the inventive concept. For example, the memory device 1310 may include the semiconductor packages 1, 2, 3, 4, 1a, 1b, 2a, 2b, 3a, 3b, 4a, and 4b of FIGS. 1A, 2A, 3A, 4A, and 25A through 28B. In addition, the memory controller 1320 and the host 1330 may include such semiconductor packages.

The memory controller 1320 may read data from the memory device 1310 or store the data of the memory device 1310 in response to a read/write request of a host 1330.

Embodiments include a high capacity semiconductor package capable of minimizing a volume thereof to solve the above stated problem.

According to an embodiment, there is provided a semiconductor package comprising: a package base substrate comprising a bonding pad; a plurality of semiconductor chips each comprising a semiconductor substrate comprising an active surface and a non-active surface that are opposite to each other and a semiconductor device formed on the active surface of the semiconductor substrate, and shifted by a predetermined distance in a first direction such that at least a part of the active surface is exposed, and stacked on the package base substrate; and a bonding wire for electrically connecting each of the plurality of semiconductor chips and the bonding pad, wherein at least one of the plurality of semiconductor chips comprises: a first pad electrically connected to the semiconductor device; a conductive pattern having the same level as that of the semiconductor substrate and more closely adjacent to an edge of the semiconductor substrate than the first pad; and a second pad connected onto the first pad, spaced apart from the conductive pattern, and extending onto the conductive pattern, wherein the bonding wire is connected to the second pad.

The second pad may extend to be more closely adjacent to the edge of the semiconductor substrate than the conductive pattern.

The at least one of the plurality of semiconductor chips may further comprise: a first insulation layer having an opening exposing the first pad and covering the conductive pattern, wherein the second pad may extend onto the conductive pattern having the first insulation layer between the second pad and the conductive pattern.

The second pad entirely may cover the first pad exposed by the first insulation layer.

The second pad may comprise a base portion contacting the first pad and an extension portion formed on the first insulation layer, wherein the base portion and the extension portion may be connected to each other by a step difference.

The extension portion may comprise a first extension portion extending in an edge of the semiconductor substrate from the base portion and a second extension portion extending in a direction opposite to the edge of the semiconductor substrate from the base portion.

The second pad may extend to the edge of the semiconductor substrate.

The second pad may extend to be adjacent to the edge of the semiconductor substrate and spaced apart from the edge of the semiconductor substrate.

The at least one of the plurality of semiconductor chips may further comprise: a second insulation layer exposing a part of the second pad and covering other parts of the second pad.

The second insulation layer may entirely cover side surfaces of the second pad.

The second insulation layer may expose a part of side surfaces of the second pad.

According to another embodiment, there is provided a semiconductor package comprising: a package base substrate comprising a bonding pad; a plurality of semiconductor chips each comprising a semiconductor substrate comprising an active surface and a non-active surface that are opposite to each other, a semiconductor device formed on the active surface of the semiconductor substrate, a first pad electrically connected to the semiconductor device and formed on the active surface, a conductive pattern extending in an edge of the semiconductor substrate from the first pad and integrally formed with the first pad; and a second pad connected onto the first pad, spaced apart from the conductive pattern, and extending onto the conductive pattern, wherein the plurality of semiconductor chips are shifted by a predetermined distance in a first direction such that at least a part of the second pad is exposed and are stacked on the package base substrate; and a bonding wire for connecting the second pad of each of the plurality of semiconductor chips and the bonding pad.

The second pad may comprise a base portion formed on the first pad and an extension portion formed on the first insulation layer and connected to the base portion by a step difference, and wherein the bonding wire may connect the extension portion and the bonding pad.

The semiconductor package may further comprise a protection layer covering the second pad and having an open space formed to expose a part of the base portion and a part of the extension portion.

The plurality of semiconductor chips may be shifted in the first direction such that at least a part of the second pad of a lower semiconductor chip is exposed and are stacked on the package base substrate.

While embodiments have been particularly shown and described with reference to exemplary embodiments, it will be understood that various changes in form and details may be made therein without departing from the spirit and scope of the following claims.

What is claimed is:

1. A semiconductor package comprising:
   a package substrate comprising a bonding pad;
   a plurality of semiconductor chips stacked on the package substrate; and
   a bonding wire configured to electrically connect the semiconductor chips and the bonding pad;
   wherein for each semiconductor chip of at least one of the plurality of semiconductor chips, the semiconductor chip comprises:
   a semiconductor device;
   a first pad electrically connected to the semiconductor device;
   a conductive pattern; and
   a second pad electrically connected to the first pad, spaced apart from the conductive pattern, extending over the conductive pattern, and connected to the bonding wire.

2. The semiconductor package of claim 1, wherein for each semiconductor chip of the at least one of the plurality of semiconductor chips, the second pad extends to be more closely adjacent to an edge of a semiconductor substrate of the semiconductor chip than the conductive pattern.

3. The semiconductor package of claim 1, wherein for each semiconductor chip of the at least one of the plurality of semiconductor chips, the conductive pattern is disposed on a same level as the first pad and is disposed closer to an edge of a semiconductor substrate of the semiconductor chip than the first pad.

4. The semiconductor package of claim 1, wherein for each semiconductor chip of the at least one of the plurality of semiconductor chips:
   the semiconductor chip further comprises a first insulation layer having an opening exposing at least part of the first pad and covering the conductive pattern; and
   the second pad extends over the conductive pattern with the first insulation layer between the second pad and the conductive pattern.

5. The semiconductor package of claim 4, wherein for each semiconductor chip of the at least one of the plurality of semiconductor chips, the second pad entirely covers the first pad exposed by the first insulation layer.

6. The semiconductor package of claim 4, wherein for each semiconductor chip of the at least one of the plurality of semiconductor chips:
   the second pad comprises a base portion contacting the first pad and an extension portion formed on the first insulation layer; and
   the base portion and the extension portion are connected to each other by a step.

7. The semiconductor package of claim 6, wherein for each semiconductor chip of the at least one of the plurality of semiconductor chips, the extension portion comprises a first extension portion extending towards an edge of a semiconductor substrate of the semiconductor chip from the base portion and a second extension portion extending in a direction opposite to the edge of the semiconductor substrate from the base portion.

8. The semiconductor package of claim 1, wherein for each semiconductor chip of the at least one of the plurality of semiconductor chips, the second pad extends to an edge of a semiconductor substrate of the semiconductor chip.

9. The semiconductor package of claim 1, wherein for each semiconductor chip of the at least one of the plurality of semiconductor chips, the second pad extends to be adjacent to an edge of a semiconductor substrate of the semiconductor chip and spaced apart from the edge of the semiconductor substrate.

10. The semiconductor package of claim 1, wherein each semiconductor chip of the at least one of the plurality of semiconductor chips further comprises an insulation layer exposing a part of the second pad and covering other parts of the second pad.

11. The semiconductor package of claim 10, wherein for each semiconductor chip of the at least one of the plurality of semiconductor chips, the insulation layer entirely covers side surfaces of the second pad.

12. The semiconductor package of claim 10, wherein for each semiconductor chip of the at least one of the plurality of semiconductor chips, the insulation layer exposes a part of side surfaces of the second pad.

13. The semiconductor package of claim 10, wherein for each semiconductor chip of the at least one of the plurality of semiconductor chips:
   another semiconductor chip of the semiconductor chips is stacked on the insulation layer; and
   an edge of a semiconductor substrate of the other semiconductor chip closest the second pad is offset from a corresponding edge of the insulation layer.

14. The semiconductor package of claim 1, wherein for each semiconductor chip of the at least one of the plurality of semiconductor chips:
   the second pad comprises a base portion and an extension portion;
   the base portion contacts the first pad;
   the extension portion extends from the base portion towards an edge of a semiconductor substrate of the semiconductor chip; and
   the semiconductor chip further comprises an insulation layer covering the base portion and exposing at least part of the extension portion.

15. A semiconductor package comprising:
   a package substrate; and
   a plurality of semiconductor chips stacked on the package substrate, at least one of the semiconductor chips comprising:
   a semiconductor device formed on a semiconductor substrate;
   a first pad electrically connected to the semiconductor device;
   a conductive pattern extending adjacent an edge of the semiconductor substrate from the first pad and integrally formed with the first pad; and
   a second pad electrically connected to the first pad, spaced apart from the conductive pattern, and extending over the conductive pattern;
   wherein the plurality of semiconductor chips are shifted such that at least a part of the second pad of the at least one of the semiconductor chips is exposed.

16. The semiconductor package of claim 15, further comprising:
   a bonding wire; and
   a bonding pad disposed on the package substrate;
   wherein for the at least one of the semiconductor chips:
   the second pad comprises a base portion formed on the first pad and an extension portion disposed over the conductive pattern and connected to the base portion by a step; and
   the bonding wire connects the extension portion and the bonding pad.

17. The semiconductor package of claim 16, the at least one of the semiconductor chips further comprises a protection layer covering the second pad and having an open space formed to expose a part of the base portion and a part of the extension portion.

* * * * *